(12) United States Patent
Boesch et al.

(10) Patent No.: US 11,836,608 B2
(45) Date of Patent: *Dec. 5, 2023

(54) CONVOLUTION ACCELERATION WITH EMBEDDED VECTOR DECOMPRESSION

(71) Applicants: STMICROELECTRONICS S.r.l., Agrate Brianza (IT); STMicroelectronics International N.V., Geneva (CH)

(72) Inventors: Thomas Boesch, Rovio (CH); Giuseppe Desoli, San Fermo Della Battaglia (IT); Surinder Pal Singh, Noida (IN); Carmine Cappetta, Battipaglia (IT)

(73) Assignees: STMICROELECTRONICS S.r.l., Agrate Brianza (IT); STMicroelectronics International N.V., Geneva (CH)

( * ) Notice: Subject to any disclaimer, the term of this patent is extended or adjusted under 35 U.S.C. 154(b) by 0 days.

This patent is subject to a terminal disclaimer.

(21) Appl. No.: 18/056,937

(22) Filed: Nov. 18, 2022

(65) Prior Publication Data

US 2023/0084985 A1    Mar. 16, 2023

Related U.S. Application Data

(63) Continuation of application No. 16/909,673, filed on Jun. 23, 2020, now Pat. No. 11,531,873.

(51) Int. Cl.
 *G06N 3/063* (2023.01)
 *G06F 9/50* (2006.01)
 *H03M 7/30* (2006.01)

(52) U.S. Cl.
 CPC ........... *G06N 3/063* (2013.01); *G06F 9/5027* (2013.01); *H03M 7/3082* (2013.01); *H03M 7/6005* (2013.01)

(58) Field of Classification Search
 CPC ... G06N 3/063; H03M 7/6005; H03M 7/3082
 (Continued)

(56) References Cited

U.S. PATENT DOCUMENTS

| 5,189,665 A | 2/1993 | Niehaus et al. |
| 5,506,815 A | 4/1996 | Hsieh et al. |

(Continued)

FOREIGN PATENT DOCUMENTS

| CN | 101093577 A | 12/2007 |
| CN | 101578590 A | 11/2009 |

(Continued)

OTHER PUBLICATIONS

"CS 179 Lecture 4: GPU Compute Architecture," Slideshow Presentation, 2015, 29 pages.

(Continued)

*Primary Examiner* — Peguy Jean Pierre
(74) *Attorney, Agent, or Firm* — SEED INTELLECTUAL PROPERTY LAW GROUP LLP

(57) ABSTRACT

Techniques and systems are provided for implementing a convolutional neural network. One or more convolution accelerators are provided that each include a feature line buffer memory, a kernel buffer memory, and a plurality of multiply-accumulate (MAC) circuits arranged to multiply and accumulate data. In a first operational mode the convolutional accelerator stores feature data in the feature line buffer memory and stores kernel data in the kernel data buffer memory. In a second mode of operation, the convolutional accelerator stores kernel decompression tables in the feature line buffer memory.

24 Claims, 13 Drawing Sheets

(58) Field of Classification Search
USPC .............................................. 706/41; 341/50
See application file for complete search history.

(56) References Cited

U.S. PATENT DOCUMENTS

| | | | |
|---|---|---|---|
| 5,768,613 | A | 6/1998 | Asghar |
| 5,996,058 | A | 11/1999 | Song et al. |
| 6,011,779 | A | 1/2000 | Wills |
| 6,668,290 | B1 | 12/2003 | Nelson |
| 7,737,994 | B1 | 6/2010 | Wasserman et al. |
| 7,782,873 | B2 | 8/2010 | Sharma et al. |
| 7,840,403 | B2 | 11/2010 | Mehrotra et al. |
| 8,131,659 | B2 | 3/2012 | Xu et al. |
| 9,020,276 | B2 | 4/2015 | Vigliar et al. |
| 9,294,097 | B1 | 3/2016 | Vassiliev |
| 9,294,403 | B2 | 3/2016 | Mejia et al. |
| 9,436,637 | B2 | 9/2016 | Kommanaboyina |
| 9,652,390 | B2 | 5/2017 | Gu et al. |
| 10,078,620 | B2 | 9/2018 | Farabet et al. |
| 10,296,829 | B2 | 5/2019 | Mostafa et al. |
| 10,394,929 | B2 | 8/2019 | Tsai et al. |
| 10,417,364 | B2 | 9/2019 | Boesch et al. |
| 10,417,560 | B2 | 9/2019 | Henry et al. |
| 10,438,115 | B2 | 10/2019 | Henry et al. |
| 10,452,605 | B2 | 10/2019 | Wang et al. |
| 10,482,155 | B2 | 11/2019 | Werner et al. |
| 10,546,211 | B2 | 1/2020 | Shacham et al. |
| 10,552,222 | B2 | 2/2020 | Wang et al. |
| 10,586,148 | B2 | 3/2020 | Henry et al. |
| 10,643,129 | B2 | 5/2020 | Chen et al. |
| 10,909,728 | B1 | 2/2021 | Appalaraju et al. |
| 11,003,985 | B2 | 5/2021 | Kim et al. |
| 11,334,768 | B1 | 5/2022 | Brody |
| 11,388,416 | B2 | 7/2022 | Habibian et al. |
| 11,531,873 | B2 * | 12/2022 | Boesch ............... H03M 7/6005 |
| 2002/0145779 | A1 | 10/2002 | Strasser et al. |
| 2003/0086421 | A1 | 5/2003 | Awsienko et al. |
| 2004/0158623 | A1 | 8/2004 | Avida et al. |
| 2005/0138582 | A1 | 6/2005 | So et al. |
| 2005/0183055 | A1 | 8/2005 | Herrera |
| 2005/0268070 | A1 | 12/2005 | Baxter |
| 2010/0005238 | A1 | 1/2010 | Jeddeloh et al. |
| 2010/0061726 | A1 | 3/2010 | Barbarossa et al. |
| 2010/0077079 | A1 | 3/2010 | Xu et al. |
| 2010/0115249 | A1 | 5/2010 | Paltashev et al. |
| 2011/0002947 | A1 | 1/2011 | Bouchard et al. |
| 2011/0029471 | A1 | 2/2011 | Chakradhar et al. |
| 2012/0287344 | A1 | 11/2012 | Choi et al. |
| 2012/0303932 | A1 | 11/2012 | Farabet et al. |
| 2013/0156278 | A1 | 6/2013 | Kim et al. |
| 2015/0046674 | A1 | 2/2015 | Barry et al. |
| 2015/0170021 | A1 | 6/2015 | Lupon et al. |
| 2015/0212955 | A1 | 7/2015 | Easwaran |
| 2015/0261702 | A1 | 9/2015 | Culurciello et al. |
| 2016/0092484 | A1 | 3/2016 | Finkler |
| 2016/0094827 | A1 | 3/2016 | Li et al. |
| 2016/0148004 | A1 | 5/2016 | Bakke et al. |
| 2016/0179434 | A1 | 6/2016 | Herrero Abellanas et al. |
| 2016/0217101 | A1 | 7/2016 | Johns et al. |
| 2016/0344635 | A1 | 11/2016 | Gray |
| 2016/0379109 | A1 | 12/2016 | Chung et al. |
| 2016/0379115 | A1 | 12/2016 | Burger et al. |
| 2017/0011006 | A1 | 1/2017 | Saber et al. |
| 2017/0116495 | A1 | 4/2017 | Nomura et al. |
| 2017/0262407 | A1 | 9/2017 | Wang et al. |
| 2018/0032857 | A1 | 2/2018 | Lele et al. |
| 2018/0046895 | A1 | 2/2018 | Xie et al. |
| 2018/0046900 | A1 | 2/2018 | Dally et al. |
| 2018/0046906 | A1 | 2/2018 | Dally et al. |
| 2018/0076918 | A1 | 3/2018 | Boduch et al. |
| 2018/0113649 | A1 | 4/2018 | Shafiee Ardestani et al. |
| 2018/0121796 | A1 | 5/2018 | Deisher et al. |
| 2018/0129935 | A1 | 5/2018 | Kim et al. |
| 2018/0157970 | A1 | 6/2018 | Henry et al. |
| 2018/0189063 | A1 | 7/2018 | Fleming et al. |
| 2018/0189229 | A1 | 7/2018 | Desoli et al. |
| 2018/0189231 | A1 | 7/2018 | Fleming, Jr. et al. |
| 2018/0189424 | A1 | 7/2018 | Boesch et al. |
| 2018/0189641 | A1 | 7/2018 | Boesch et al. |
| 2018/0189642 | A1 | 7/2018 | Boesch et al. |
| 2018/0189981 | A1 | 7/2018 | Singh et al. |
| 2018/0197084 | A1 | 7/2018 | Kim et al. |
| 2018/0204110 | A1 | 7/2018 | Kim et al. |
| 2018/0255385 | A1 | 9/2018 | Djordjevic et al. |
| 2018/0336468 | A1 | 11/2018 | Kadav et al. |
| 2018/0336469 | A1 | 11/2018 | O'Connor et al. |
| 2019/0026626 | A1 | 1/2019 | Du et al. |
| 2019/0266479 | A1 | 8/2019 | Singh et al. |
| 2019/0266485 | A1 | 8/2019 | Singh et al. |
| 2019/0266784 | A1 | 8/2019 | Singh et al. |
| 2019/0340488 | A1 | 11/2019 | Fishel et al. |
| 2019/0340508 | A1 | 11/2019 | Liu et al. |
| 2019/0392297 | A1 | 12/2019 | Lau et al. |
| 2020/0092556 | A1 | 3/2020 | Coelho et al. |
| 2020/0228840 | A1 | 7/2020 | Fracastoro et al. |
| 2020/0272779 | A1 | 8/2020 | Boesch et al. |
| 2020/0280717 | A1 | 9/2020 | Li et al. |
| 2020/0293487 | A1 | 9/2020 | Anderson et al. |
| 2020/0304802 | A1 | 9/2020 | Habibian et al. |
| 2020/0304804 | A1 | 9/2020 | Habibian et al. |
| 2020/0364288 | A1 | 11/2020 | Wen et al. |
| 2021/0021823 | A1 | 1/2021 | Na et al. |
| 2021/0073450 | A1 | 3/2021 | Boesch et al. |
| 2021/0125070 | A1 | 4/2021 | Wang et al. |
| 2021/0125380 | A1 | 4/2021 | Lee et al. |
| 2021/0150767 | A1 | 5/2021 | Ikai et al. |
| 2021/0216752 | A1 | 7/2021 | Trani et al. |
| 2021/0232407 | A1 | 7/2021 | Liu |
| 2021/0319290 | A1 | 10/2021 | Mills et al. |
| 2021/0397966 | A1 | 12/2021 | Sun et al. |
| 2022/0027715 | A1 | 1/2022 | Carrera et al. |
| 2022/0138992 | A1 | 5/2022 | Wu et al. |

FOREIGN PATENT DOCUMENTS

| | | |
|---|---|---|
| CN | 101739241 A | 6/2010 |
| CN | 105247821 A | 1/2016 |
| CN | 105659099 A | 6/2016 |
| CN | 105892989 A | 8/2016 |
| CN | 106951961 A | 7/2017 |
| CN | 109255429 A | 1/2019 |
| CN | 106228240 B | 9/2020 |
| EP | 1087533 A1 | 3/2001 |
| WO | 9602895 A1 | 2/1996 |
| WO | 2018120019 A1 | 7/2018 |
| WO | 2019045883 A1 | 3/2019 |
| WO | 2019093234 A1 | 5/2019 |

OTHER PUBLICATIONS

Abdelgawad et al., "High Level Synthesis of Canny Edge Detection Algorithm on Zynq Platform," *International Journal of Computer, Electrical, Automation, Control and Information Engineering* 9(1):148-152, 2015.

Alawad et al., "Stochastic-Based Deep Convolutional Networks with Reconfigurable Logic Fabric," *IEEE Transactions on Multi-Scale Computing Systems* 2(4):242-256, 2016.

Albericio et al., "Bit-Pragmatic Deep Neural Network Computing," Oct. 20, 2016. (12 pages).

Boo et al., Compression of Deep Neural Networks with Structured Sparse Ternary Coding, *Journal of Signal Processing Systems* 91:1009-1019, Nov. 6, 2018.

Cavigelli et al., "Origami: A 803 GOp/s/W Convolutional Network Accelerator," *IEEE Transactions on Circuits and Systems for Video Technology* 27(11):2461-2475, 2017.

Cesur et al., "On an Improved FPGA Implementation of CNN-based Gabor-Type filters," *IEEE Transactions on Circuits and Systems—II Express Briefs* 59(11):815-819, 2012.

Chang et al., "Mitigating Asymmetric Nonlinear Weight Update Effects in Hardware Neural Network Based on Analog Resistive Synapse," *IEEE Journal on Emerging and Selected Topics in Circuits and Systems* 8(1):116-124, 2018.

(56) References Cited

OTHER PUBLICATIONS

Chen et al., "A High-Throughput Neural Network Accelerator," IEEE Micro 35(3):24-32, May 2015.
Chen et al., "DaDianNao: A Machine-Learning Supercomputer," 2014 47th Annual IEEE/ACM International Symposium on Microarchitecture, Dec. 13-17, 2014, Cambridge, United Kingdom, 14 pages.
Chen et al., "DianNao: A Small-Footprint High-Throughput Accelerator for Ubiquitous Machine-Learning," Proceedings of the 19th international conference on Architectural support for programming languages and operating systems (ASPLOS), 2014, pp. 269-283.
Chen et al., "Eyeriss: An Energy-Efficient Reconfigurable Accelerator for Deep Convolutional Neural Networks," 2016 IEEE International Solid-State Circuits Conference, Jan. 31-Feb. 4, 2016, San Francisco, CA, 3 pages.
Cheung, "The Cross Bar Switch," Downloaded on Sep. 3, 2019 from www.mathcs.emory.edu/-cheung/Courses/355/Syllabus/90-parallel/CrossBar.html.
Chi et al., "PRIME: A Novel Processing-in-Memory Architecture for Neural Network Computation in ReRAM-Based Main Memory," Jun. 18-22, 2016, ACM/IEEE 43rd Annual International Symposium on Computer Architecture (ISCA), pp. 27-39.
Choudhary et al., "NETRA: A Hierarchical and Partitionable Architecture for Computer Vision Systems," *IEEE Transactions on Parallel and Distributed Systems* 4(10):1092-1104, 1993.
Choudhary, "Parallel Architectures and Parallel Algorithms for Integrated Vision Systems," Thesis, University of Illinois at Urbana-Champaign, Champaign, Illinois, 1989, 200 pages.
Conti et al., "A Ultra-Low-Energy Convolution Engine for Fast Brain-Inspired Vision in Multicore Clusters," *Automations & Test in Europe Conference & Exhibition*, Mar. 9-13, 2015, Grenoble, France, pp. 683-688.
DeBole et al., "FPGA-Accelerator System for Computing Biologically Inspired Feature Extraction Models," *2011 Conference Record of the Forty Fifth Asilomar Conference on Signals, Systems and Computers (ASILOMAR)*, Nov. 6-9, 2011, Pacific Grove, California, pp. 751-755.
DeHon et al., "Stream computations organized for reconfigurable execution," *Microprocessors and Microsystems* 30(6):334-354, 2006.
Desoli et al., "14.1: A 2.9TOPS/W Deep Convolutional Neural Network SoC in FD-SOI 28nm for Intelligent Embedded Systems," *IEEE International Solid-State Circuits Conference (ISSCC)*, San Francisco, California, Feb. 5-9, 2017, pp. 238-239. (3 pages).
DiCecco et al., "Caffeinated FPGAs: FPGA Framework For Convolutional Neural Networks," arXiv:1609.09671, 8 pages, 2016.
Du et al., "ShiDianNao: Shifting Vision Processing Closer To The Sensor," *2015 ACM/IEEE 42nd Annual International Symposium on Computer Architecture (ISCA)*, Portland, Oregon, Jun. 13-17, 2015, pp. 92-104.
Dundar, "Learning from minimally labeled data with accelerated convolutional neural networks," Doctoral Thesis, Purdue University, West Lafayette, Indiana, 2016, 150 pages.
Extended European Search Report, dated May 18, 2018, for European Application No. 17196986.8-1221, 11 pages.
Extended European Search Report, dated May 18, 2018, for European Application No. 17197117.9-1221, 15 pages.
Extended European Search Report, dated May 23, 2018, for European Application No. 17197028.8-1221, 15 pages.
Extended European Search Report, dated May 7, 2018, for European Application No. 17197155.9-1221, 10 Pages.
Extended European Search Report, dated May 9, 2018, for European Application No. 17197096.5-1221, 12 Pages.
Gokhale et al., "A 240 G-ops/s Mobile Coprocessor for Deep Neural Networks (Invited Paper)," *The IEEE Conference on Computer Vision and Pattern Recognition (CVPR) Workshop*, Columbus, Ohio, Jun. 23-28, 2014, 6 pages.
Gong et al., "Compressing Deep Convolutional Networks using Vector Quantization," arXiv:1412.6115 [cs.CV], Dec. 2014, 10 pages.
Graf et al., "A Massively Parallel Digital Learning Processor," *Advances in Neural Information Processing Systems (NIPS)*, pp. 529-536, 2009.
Gray et al., "MOS Operational Amplifier Design—A Tutorial Overview," *IEEE Journal of Solid-State Circuits SC-17*(6):969-982, Dec. 1982.
Guo et al., "Angel-Eye: A Complete Design Flow for Mapping CNN onto Customized Hardware," 2016 IEEE Computer Society Annual Symposium on VLSI (ISVLSI), Jul. 11, 2016, pp. 24-29.
Gysel et al., "Hardware-Oriented Approximation of Convolutional Neural Networks." arXiv:1604.03168, 8 pages, 2016.
Huang et al., "A Vector-Quantization Compression Circuit With On-Chip Learning Ability for High-Speed Image Sensor," *IEEE Access* 5:22132-22143, 2017.
Huang, et al., "eCNN: A Block-Based and Highly Parallel CNN Accelerator for Edge Inference", MICRO-52, 2019, 14 pages.
Jagannathan et al., "Optimizing Convolutional Neural Network on DSP," IEEE International Conference on Consumer Electronics, Jan. 7-11, 2016, Las Vegas, Nevada, pp. 371-372.
Jain, "Parallel Processing With the TMS320C40 Parallel Digital Signal Processor," Texas Instruments, SPRAO53, pp. 1-32, 1994 (34 pages).
Jin et al., "An Efficient Implementation of Deep Convolutional Neural Networks on a Mobile Coprocessor," *57th International Midwest Symposium on Circuits and Systems (MWSCAS)*, Aug. 3-6, 2014, College Station, Texas, pp. 133-136.
Koscielnicki, "n Vidia Hardware Documentation," Release git, Dec. 16, 2016, 631 pages.
Krizhevsky et al., "ImageNet Classification with Deep Convolutional Neural Networks," 25th International Conference on Neural Information Processing Systems, Dec. 3-6, 2012, Lake Tahoe, Nevada, 9 pages.
Kurugöllü et al., "Advanced educational Parallel DSP system based on TMS320C25 Processors," *Microprocessors and Microsystems* 19(3):147-156, 1995.
LeCun et al., "Deep Learning Tutorial," Slideshow Presentation, 2013, 204 pages.
LeCun et al., "Deep Learning: Nature Review," Slideshow Presentation, 2016, 44 pages.
LeCun et al., "Gradient-Based Learning Applied to Document Recognition," *Proceedings of the IEEE* 86(11):2278-2324, Nov. 1998.
Lee et al., "Convolutional Neural Network Accelerator with Vector Quantization," IEEE International Symposium on Circuits and Systems (ISCAS), May 26, 2019, pp. 1-5.
Lee, "Deep Learning Methods for Vision," Slideshow Presentation, 2012, 102 pages.
Lei et al., "Scadis: A Scalable Accelerator for Data-Intensive String Set Matching on FPGAs," IEEE TrustCom-BigDataSE-ISPA, Aug. 23-26, 2016, Tianjin, China, pp. 1190-1197.
Lenart, "Design of Reconfigurable Hardware Architectures for Real-time Applications," thesis, Lund University, Lund, Sweden, 2008, 195 pages.
Li et al., "A High Performance FPGA-based Accelerator for Large-Scale Convolutional Neural Networks," 1-9, 2016.
Lian, "A Framework for FPGA-Based Acceleration of Neural Network Inference with Limited Numerical Precision Via High-Level Synthesis With Streaming Functionality," Thesis, University of Toronto, Toronto, Ontario, Canada, 2016, 117 pages.
Liu et al., "Pruning of Winograd and FFT Based Convolution Algorithm," 1-7, 2016.
Lloyd "Least Squares Quantization in PCM," *IEEE Transactions on Information Theory IT*—28(2):129-137, 1982.
Matteucci, "Deep Learning—Introduction," Slideshow Presentation, 2015, 79 pages.
Meloni et al., "A High-Efficiency Runtime Reconfigurable IP for CNN Acceleration on a Mid-Range All-Programmable SoC," International Conference on ReConFigurable Computing and FPGAs (ReConFig), Nov. 30-Dec. 2, 2016, Cancun, Mexico, 8 pages.
Moctar et al., "Routing Algorithms for FPGAS with Sparse Intra-Cluster Routing Crossbars," 22nd International Conference on Field Programmable Logic and Applications (FPL), Aug. 29-31, 2012, Oslo, Norway, pp. 91-98.

(56) References Cited

OTHER PUBLICATIONS

Monson et al., "Implementing High-Performance, Low-Power FPGA-based Optical Flow Accelerators in C," 24th International Conference on Application-Specific Systems, Architectures and Processors (ASAP), Jun. 5-7, 2013, Washington, DC, 7 pages.

Nair et al., "Rectified Linear Units Improve Restricted Boltzmann Machines," Proceedings of the 27th International Conference on Machine Learning, Haifa, Israel, Jun. 21, 2010, 8 pages.

Nvidia, "Nvidia's Next Generation CUDA Compute Architecture: Fermi™," Whitepaper, 2009, 22 pages.

Paulino, "Generation of Custom Run-time Reconfigurable Hardware for Transparent Binary Acceleration," dissertation, Faculdade de Engenharia da Universidade do Porto, Jun. 2016. (202 pages).

Porter et al., "Lucas-Kanade Optical Flow Accelerator," MIT 6.375, May 11, 2011, 22 pages.

Qin et al., "How Convolutional Neural Networks See the World—A Survey of Convolutional Neural Network Visualization Methods," *Mathematical Foundations of Computing* 1(2):149-180, 2018 (32 pages).

Qiu et al., "A Hardware Accelerator with Variable Pixel Representation & Skip Mode Prediction for Feature Point Detection Part of SIFT Algorithm," 2009 IAPR Conference on Machine Vision Applications, May 20-22, 2009, Yokohama, Japan, 4 pages.

Rahman et al., "Efficient FPGA Acceleration of Convolutional Neural Networks Using Logical-3D Compute Array," *Design, Automation & Test in Europe Conference & Exhibition*, Mar. 14-18, 2016, Dresdon, Germany, pp. 1393-1398.

Roque et al., "Adapting the Sobel Edge Detector and Canny Edge Extractor for iPhone 3GS architecture," 17th International Conference on Systems, Signals and Image Processing, Jun. 17-19, 2010, Rio de Janeiro, Brazil, 4 pages.

Sedcole, "Reconfigurable Platform-Based Design in FPGAs for Video Image Processing," doctoral thesis, University of London, London, UK, 2006, 206 pages.

Shen et al., "Maximizing CNN Accelerator Efficiency Through Resource Partitioning," Jun. 30, 2016. (12 pages).

Shen, et al., "Escher: A Cnn Accelerator with Flexible Buffering To Minimize Off-Chip Transfer", 2017 IEEE 25th Annual International Symposium on Field-Programmable Custom Computing Machines (FCCM), Napa, CA, 2017, pp. 93-100.

Shi et al., "A Locality Aware Convolutional Neural Networks Accelerator," *Euromicro Conference on Digital System Design*, Aug. 26-28, 2015, Funchal, Portugal, pp. 591-598.

Sim et al., "A 1.42TOPS/W Deep Convolutional Neural Network Recognition Processor for Intelligent IoE Systems," 2016 IEEE International Solid-State Circuits Conference, Jan. 31-Feb. 4, 2016, San Francisco, CA, 3 pages.

Stensland, "INF5063—GPU & CUDA," Slideshow Presentation, 2011, 44 pages.

Stenström, "Reducing Contention in Shared-Memory Multiprocessors," *Computer* 21(11):26-37, 1988.

Venieris et al., "fpgaConvNet: A Framework for Mapping Convolutional Neural Networks on FPGAs," *IEEE 24th Annual International Symposium On Field-Programmable Custom Computing Machines (FCCM)*, IEEE Computer Society, Washington DC, May 1-3, 2016, pp. 40-47.

Wang et al., "DLAU: A Scalable Deep Learning Accelerator Unit on FPGA" *IEEE Transactions on Computer-Aided Design of Integrated Circuits and Systems* 36(3):513-517, 2017.

Wang, et al., "PipeCNN: An OpenCL-Based FPGA Accelerator for Large-Scale Convolution Neuron Networks", 2017 International Conference on Field Programmable Technology (ICFPT), Melbourne, VIC, 2017, pp. 279-282.

Wu et al., "Accelerator Design for Vector Quantized Convolutional Neural Network," IEEE International Conference on Artificial Intelligence Circuits and Systems, Mar. 18-20, 2019, Hsinchu, Taiwan, ppg 46-50.

Xia et al., "Dynamic Look-up Table Method for Optimizing the Training of Deep Neural Networks on Many-Core Architecture," IEEE 7th International Conference on Computer Science and Network Technology, Oct. 19-20, 2019, Dalian, China, pp. 216-225.

Yao et al., "Hardware-Friendly Convolutional Neural Network with Even-Number Filter Size," Workshop track—ICLR 2016, 4 pages, 2016.

Yin, et al. "Parana: A Parallel Neural Architecture Considering Thermal Problem of 3D Stacked Memory", IEEE Transactions On Parallel and Distributed Systems, vol. 29, 2018, 15 pages.

Yu et al., "FPGA-based Accelerator for Convolutional Neural Network," *Computer Engineering* 43(1):109-119, 2017 (with English abstract).

Zamanidoost et al., "Low Area Overhead In-situ Training Approach for Memristor-Based Classifier," Proceedings of the 2015 IEEE/ACM International Symposium on Nanoscale Architectures (NANOARCH'15), Jul. 8-10, 2015, Boston, Massachusetts, pp. 139-142.

Zhao et al., "Leveraging MLC STT-RAM for Energy-efficient CNN Training," MEMSYS '18: Proceedings of the International Symposium on Memory Systems, Oct. 2018, Alexandria, Virginia, pp. 279-290.

Zhao et al., "Pie: A Pipeline Energy-efficient Accelerator for Inference Process in Deep Neural Networks," IEEE 22nd International Conference on Parallel and Distributed Systems (ICPADS), Dec. 13-16, 2016, Wuhan, China, 8 pages.

* cited by examiner

| Net (per instance) | Total Conv KVAL | Conv MACs | Average Conv MAC/KVAL | Total FC KVAL | FC MACs | FC MAC/KVAL |
|---|---|---|---|---|---|---|
| Alexnet | 2.3 M | 665.8 MMAC | 289.5 | 58.6 M | 58.6 MMAC | 1 |
| VGG16 | 14.8 M | 15346.6 MMAC | 1036.9 | 123.6 M | 123.6 MMAC | 1 |
| RESNET50 | 22.9 M | 3855.9 MMAC | 168.4 | 2.04 M | 2.04 MMAC | 1 |
| GoogleNet | 5.9 M | 1581.6 MMAC | 268.1 | 1.024 M | 1.024 MMAC | 1 |

*FIG. 10A*

| Net (per instance) | Total Conv KVAL | Number of cycles to load KVAL | Conv MACs | Min Number of cycles Conv MACs | Total FC KVAL | FC MACs | Number of cycles to load FC KVAL |
|---|---|---|---|---|---|---|---|
| Alexnet | 2.3 M | 11.5 M cycles | 665.8 MMAC | 9.2 M cycles | 58.6 M | 58.6 MMAC | 293 M cycles |
| VGG16 | 14.8 M | 74 M cycles | 15346.6 MMAC | 213.1 M cycles | 123.6 M | 123.6 MMAC | 618 M cycles |
| RESNET50 | 22.9 M | 114.5 M cycles | 3855.9 MMAC | 53.6 M cycles | 2.04 M | 2.04 MMAC | 10.2 M cycles |
| GoogleNet | 5.9 M | 29.5 M cycles | 1581.6 MMAC | 21.9 M cycles | 1.024 M | 1.024 MMAC | 5.1 M cycles |

*FIG. 10B*

CONVOLUTION ACCELERATION WITH EMBEDDED VECTOR DECOMPRESSION

BACKGROUND

Technical Field

The present disclosure generally relates to neural networks. More particularly, but not exclusively, the present disclosure relates to utilization and re-utilization of hardware resources in a convolution accelerator.

Description of the Related Art

Known computer vision, speech recognition, and signal processing applications benefit from the use of convolutional neural networks (CNN). A CNN is a computer-based tool that processes large quantities of data and adaptively "learns" by conflating proximally related features within the data, making broad predictions about the data, and refining the predictions based on reliable conclusions and new conflations. The CNN is arranged in a plurality of "layers," and different types of predictions are made at each layer.

For example, if a plurality of two-dimensional pictures of faces is provided as input to a CNN, the CNN will learn a variety of characteristics of faces such as edges, curves, angles, dots, color contrasts, bright spots, dark spots, etc. These one or more features are learned at one or more first layers of the CNN. Then, in one or more second layers, the CNN will learn a variety of recognizable features of faces such as eyes, eyebrows, foreheads, hair, noses, mouths, cheeks, etc.; each of which is distinguishable from all of the other features. That is, the CNN learns to recognize and distinguish an eye from an eyebrow or any other facial feature. In one or more third and then subsequent layers, the CNN learns entire faces and higher order characteristics such as race, gender, age, emotional state, etc. The CNN may even be taught in some cases to recognize the specific identity of a person. For example, a random image can be identified as a face, and the face can be recognized as Orlando Bloom, Andrea Bocelli, or some other identity.

In other examples, a CNN can be provided with a plurality of pictures of animals, and the CNN can be taught to identify lions, tigers, and bears; a CNN can be provided with a plurality of pictures of automobiles, and the CNN can be taught to identify and distinguish different types of vehicles; and many other CNNs can also be formed and trained. CNNs can be used to learn word patterns in sentences, to identify music, to analyze individual shopping patterns, to play video games, to create traffic routes, and CNNs can be used for many other learning-based tasks too.

BRIEF SUMMARY

Techniques and systems are described herein for implementing a convolutional neural network.

In an embodiment, a hardware accelerator system for implementing a convolutional neural network (CNN), the hardware accelerator system comprises: one or more convolution accelerators, each of the one or more convolution accelerators including: a feature line buffer memory; a kernel buffer memory; and a multiply-accumulate (MAC) cluster including a plurality of MAC circuits coupled to the feature line buffer memory and to the kernel buffer memory, and which, in operation, multiply and accumulate received feature data and kernel data. The one or more convolution accelerators perform first operations in a first mode in which the feature line buffer memory stores feature data, and second operations in a second mode in which the feature line buffer memory stores kernel decompression tables. In an embodiment, the first mode is a convolutional acceleration mode and wherein the second mode is a fully connected acceleration mode. In an embodiment, during operation in the first mode, feature data is provided to the MAC cluster via the feature line buffer, and during operation in the second mode, feature data is provided to the MAC cluster via a data path that bypasses the feature line buffer memory. In an embodiment, the one or more convolution accelerators comprise one or more vector decompression engines that, during operation in the second mode, use kernel decompression tables stored in the feature line buffer to provide decompressed kernel data to one or more kernel buffer memories which then provide the kernel data to one or more of the plurality of MAC circuits of the convolutional accelerator when required. In an embodiment, the one or more vector decompression engines receive encoded kernel data streams comprising one or more kernel data frames, and the one or more kernel data frames include one or more data markers that each indicate a data type of one or more subsequent portions of the encoded kernel data stream. In an embodiment, the indicated data type is a first type signifying compressed kernel data values or a second type signifying kernel decompression tables. In an embodiment, a data marker indicates: a position associated with a next additional data marker within the kernel data frame; a table indicator associated with the data marker; or combinations thereof. In an embodiment, during operation in the second mode, a number of the plurality of MAC circuits of a MAC cluster of one of the convolutional accelerators multiply and accumulate received feature data and kernel data in parallel. In an embodiment, each of the one or more convolution accelerators comprises a vector decompression engine that, during operation in the second mode, provides kernel decompression tables to the feature line buffer for storage and decompressed kernel data to the MAC cluster of the convolutional accelerator. In an embodiment, a first of the one or more convolution accelerators initiates the second mode based at least in part on receiving a first data marker within a first kernel data stream, wherein the first data marker indicates that a subsequent portion of the first kernel data stream comprises a kernel decompression table. In an embodiment, a first of the one or more convolution accelerators initiates the first mode based at least in part on receiving a first data marker within a first kernel data stream that indicates a subsequent portion of the first kernel data stream comprises uncompressed kernel data values.

In an embodiment, a convolution accelerator comprises: a feature line buffer memory; a kernel buffer memory; and a multiply-accumulate (MAC) cluster coupled to the feature line buffer memory and to the kernel buffer memory and comprising a plurality of MAC circuits, wherein the plurality of MAC circuits, in operation, multiply and accumulate feature data and kernel data, wherein, in operation, the convolution accelerator performs first operations in a first mode in which the feature line buffer memory stores feature data, and second operations in a second mode in which the feature line buffer memory stores kernel decompression tables. In an embodiment, the first mode is a convolutional acceleration mode and the second mode is a fully connected acceleration mode. In an embodiment, the convolutional accelerator comprises a data path coupled to the MAC cluster that bypasses the feature line buffer memory, wherein, during operation in the second mode, feature data is provided to the MAC cluster via the data path that bypasses the feature line buffer memory. In an embodiment, the convolution accelerator comprises one or more vector decompression engines that, during operation in the second mode: provide vector decompression tables to the feature line buffer memory for storage; decompress compressed kernel data using the feature line tables stored in the feature line buffer memory; and provide decompressed kernel data to the kernel buffer memory. In an embodiment, the one or more vector decompression engines is associated with multiple MAC circuits of the MAC cluster. In an embodiment, the one or more vector decompression engines receive encoded kernel data streams each comprising one or more kernel data frames, wherein the one or more kernel data frames include one or more data markers that each indicate a data type of a subsequent portion of the encoded kernel data stream. In an embodiment, a data marker indicates a subsequent data portion data type is one of a group consisting of: a kernel decompression table; and compressed kernel data. In an embodiment, a data marker indicates a subsequent data portion data type is one of a group consisting of: a kernel decompression table; compressed kernel data; and uncompressed kernel data. In an embodiment, the second mode is initiated in response to receiving a first data marker within a first kernel data stream indicating a subsequent portion of the first kernel data stream comprises a kernel decompression table. In an embodiment, during operation in the second mode, the multiple MAC circuits of the MAC cluster operate in parallel to multiply and accumulate feature data and kernel data.

In an embodiment, a method comprises: operating a convolutional accelerator having a kernel data buffer memory, a feature line buffer memory, and a multiply-accumulate (MAC) cluster having a plurality of MAC circuits, in a first operational mode, the operating the convolutional accelerator in the first operational mode including: storing feature data in the feature line buffer memory; storing kernel data in the kernel data buffer memory; and performing MAC operations using feature line data stored in the feature line buffer memory, and kernel data stored in the kernel data buffer memory; and operating the convolutional accelerator in a second operational mode, the operating the convolutional accelerator in the second operational mode including: storing kernel decompression tables in the feature line buffer memory; decompressing compressed kernel data using kernel decompression tables stored in the feature line buffer memory, generating decompressed kernel data; storing the decompressed kernel data in the kernel data buffer memory; and performing MAC operations using feature line data, and decompressed kernel data stored in the kernel data buffer memory. In an embodiment, the first operational mode is a convolutional acceleration mode and the second operational mode is a fully connected acceleration mode. In an embodiment, the operating the convolutional accelerator in the second operational mode includes providing feature data to the MAC cluster via a data path that bypasses the feature line buffer memory. In an embodiment, the method comprises: in response to receiving an encoded kernel data stream, initiating operation of the convolutional accelerator in the second mode of operation. In an embodiment, operating the convolutional accelerator in the second mode of operation comprises: determining a data type of a portion of a kernel data stream based on a data marker in the kernel data stream; in response to determining the data type is a kernel decompression table: extracting kernel decompression table identification information from the data marker; and storing the kernel decompression table of the portion of the kernel data stream in the feature line buffer memory based on the extracted kernel identification information; and in response to determining the data type is compressed kernel data: extracting kernel decompression table identification information from the data marker; extracting a table index from the compress kernel data of the portion of the kernel data stream; decompressing compressed kernel data using a kernel decompression table stored in the feature buffer line memory based on the extracted table identification information and the extracted table index; and storing the decompressed kernel data in the kernel data buffer memory. In an embodiment, the second mode of operation comprises operating multiple MAC circuits of the plurality of MAC circuits to process feature data and kernel data in parallel.

In an embodiment, a non-transitory computer-readable medium has contents that, when executed by one or more hardware processors of a convolution accelerator, cause the one or more hardware processors to perform a method, the method comprising: operating the convolutional accelerator in a first operational mode, the convolutional accelerator having a kernel data buffer memory, a feature line buffer memory, and a multiply-accumulate (MAC) cluster having a plurality of MAC circuits, the operating the convolutional accelerator in the first operational mode including: storing feature data in the feature line buffer memory; storing kernel data in the kernel data buffer memory; and performing MAC operations using feature line data stored in the feature line buffer memory, and kernel data stored in the kernel data buffer memory; and operating the convolutional accelerator in a second operational mode, the operating the convolutional accelerator in the second operational mode including: storing kernel decompression tables in the feature line buffer memory; decompressing compressed kernel data using kernel decompression tables stored in the feature line buffer memory, generating decompressed kernel data; storing the decompressed kernel data in the kernel data buffer memory; and performing MAC operations using feature line data, and decompressed kernel data stored in the kernel data buffer memory. In an embodiment, the first operational mode is a convolutional acceleration mode and wherein the second operational mode is a fully connected acceleration mode. In an embodiment, operating the convolutional accelerator in the second operational mode includes providing feature data to the MAC cluster via a data path that bypasses the feature line buffer memory. In an embodiment, operating the convolutional accelerator in the second mode of operation comprises: determining a data type of a portion of a kernel data stream based on a data marker in the kernel data stream; in response to determining the data type is a kernel decompression table: extracting kernel decompression table identification information from the data marker; and storing the kernel decompression table of the portion of the kernel data stream in the feature line buffer memory based on the extracted kernel identification information; and in response to determining the data type is compressed kernel data: extracting kernel decompression table identification information from the data marker; extracting a table index from the compress kernel data of the portion of the kernel data stream; decompressing compressed kernel data using a kernel decompression table stored in the feature buffer line memory based on the extracted table identification information and the extracted table index; and storing the decompressed kernel data in the kernel data buffer memory. In an embodiment, the second mode of operation comprises operating multiple MAC circuits of the plurality of MAC circuits to process feature data and kernel data in parallel.

The tools and methods discussed in the present disclosure set forth one or more aspects and embodiments of a convolution accelerator in which memory utilized as a feature line buffer in a first convolutional mode may be utilized at least in part to store vector decompression tables during a distinct second fully connected mode.

The innovation described in the present disclosure is new and useful, and the innovation is not well-known, routine, or conventional in the silicon fabrication industry. Some portions of the innovation described herein may use known building blocks combined in new and useful ways along with other structures and limitations to create something more than has heretofore been conventionally known. The embodiments improve on known computing systems which, when un-programmed or differently programmed, do not perform or provide the specific reconfigurable framework features claimed herein.

The embodiments described herein use computerized technology to improve the technology of silicon fabrication and reconfigurable interconnects, but other techniques and tools remain available to fabricate silicon and provide reconfigurable interconnects. Therefore, the claimed subject matter does not foreclose the whole, or any substantial portion of, silicon fabrication or reconfigurable interconnect technological area.

These features, along with other objects and advantages which will become subsequently apparent, reside in the details of construction and operation as more fully described hereafter and claimed, reference being had to the accompanying drawings forming a part hereof.

This Brief Summary has been provided to introduce certain concepts in a simplified form that are further described in detail below in the Detailed Description. The Brief Summary does not identify as key or essential any particular features of the claimed subject matter, nor is it intended to limit the scope of the claimed subject matter.

BRIEF DESCRIPTION OF THE SEVERAL VIEWS OF THE DRAWINGS

FIGS. 10A and 10B illustrate aspects and limitations of various popular neural networks related to the reuse of loaded kernel parameters in fully connected layers of such neural networks.

DETAILED DESCRIPTION

Figure 1:
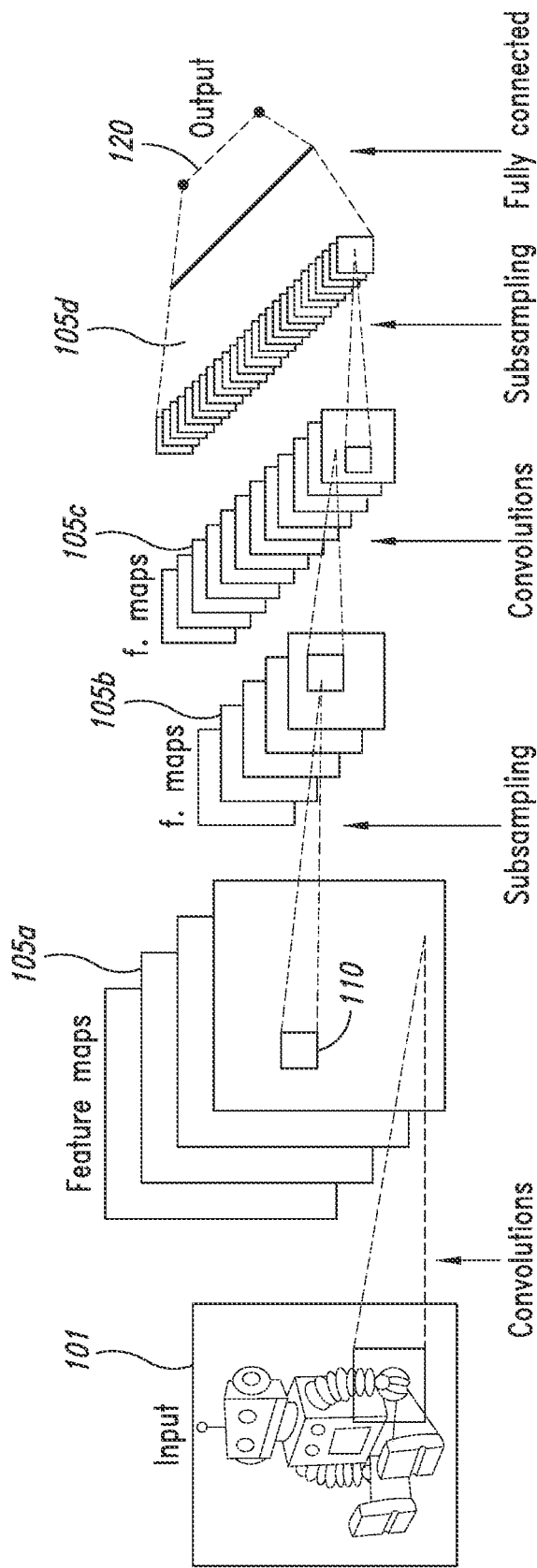
FIG. 1 depicts a process in which a convolutional neural network is used to classify an input image via use of convolutional, subsampling and fully connected layers operating on successive feature maps.

In the following description, certain details are set forth in order to provide a thorough understanding of various embodiments of devices, systems, methods and articles. However, one of skill in the art will understand that other embodiments may be practiced without these details. In other instances, well-known structures and methods associated with, for example, circuits, such as transistors, integrated circuits, logic gates, memories, interfaces, bus systems, etc., have not been shown or described in detail in some figures to avoid unnecessarily obscuring descriptions of the embodiments.

Unless the context requires otherwise, throughout the specification and claims which follow, the word "comprise" and variations thereof, such as "comprising," and "comprises," are to be construed in an open, inclusive sense, that is, as "including, but not limited to." Reference to "at least one of" shall be construed to mean either or both the disjunctive and the inclusive, unless the context indicates otherwise.

Reference throughout this specification to "one embodiment," or "an embodiment" means that a particular feature, structure or characteristic described in connection with the embodiment is included in at least one embodiment. Thus, the appearances of the phrases "in one embodiment," or "in an embodiment" in various places throughout this specification are not necessarily referring to the same embodiment, or to all embodiments. Furthermore, the particular features, structures, or characteristics may be combined in any suitable manner in one or more embodiments to obtain further embodiments.

The headings are provided for convenience only, and do not interpret the scope or meaning of this disclosure.

The sizes and relative positions of elements in the drawings are not necessarily drawn to scale. For example, the shapes of various elements and angles are not drawn to scale, and some of these elements are enlarged and positioned to improve drawing legibility. Further, the particular shapes of the elements as drawn are not necessarily intended to convey any information regarding the actual shape of particular elements, and have been selected solely for ease of recognition in the drawings.

Convolutional Neural Networks (CNN) are types of Deep Neural Networks (DNN) with one or multiple layers, each of which perform a convolution on a 3-dimensional (3D) feature data tensor (expressed as width×height×depth). Typically, the convolution operation is associated with a majority of the processing workload, commonly performing a large number of multiply-accumulate (MAC) operations per inference.

Dedicated convolution accelerators are designed to process convolution operations more efficiently, such as by exploiting a higher level of data parallelism than standard processor cores. Many CNNs also include Fully Connected (FC) layers, in which the classical 3D convolution is deformed into a Vector by Matrix operation on a feature data tensor of 1×1×Depth. These FC layers may typically be associated with a far lower level of data reuse than typical convolution operations, and may be associated with a much higher kernel data bandwidth per MAC operation compared to the classical 3D convolution.

FIG. 1 depicts a process in which a CNN is used to classify an input image 101 via alternating use of convolutional and subsampling layers of the CNN operating on successive feature maps to arrive at a classification output for the input image via a fully connected layer. In particular, multiple first feature maps 105a are generated from the input image 101 by a first convolutional layer using a kernel 110. Multiple second feature maps 105b are then generated by a first subsampling layer of the CNN, and then utilized in turn to generate a larger plurality of third feature maps 105c by a second convolutional layer of the CNN. In the depicted embodiment, a second subsampling layer of the CNN generates another still larger plurality of fourth feature maps 105d, which are accepted as input by a fully connected layer of the CNN in order to generate an N-dimensional output classification vector 120.

Fully connected layers of CNNs, as well as portions of other neural network architectures—including, as non-limiting examples, Recurrent Neural Networks (RNN) such as Long Short-Term Memory (LSTM) networks or Gated Recurrent Unit (GRU) networks—are heavily based on Vector×Matrix operations, with very limited kernel data reuse and relatively large kernel data sets. If a CNN convolution accelerator is used to also operate on FC layers (or RNNs with similar issues), the low level of kernel data reuse and the large number of multiply-accumulate units available (required to support a high level of parallelism for standard 3D convolutions) may cause kernel data bandwidth to become an inherent operational bottleneck, and may be associated with relatively low utilization of available MAC processing resources.

Efforts to overcome such a bottleneck have included increasing the kernel data bandwidth by increasing on-chip storage. However, as RNNs and FC layers of CNNs may utilize relatively large kernel data sets (such as several dozen megabytes), such efforts typically exceed cost efficiency constraints and are not feasible as a practical matter. Similarly, efforts to overcome such limitations have included storing the requisite kernel data off-chip; however, such approaches significantly limit available bandwidth for cost-sensitive and/or power-sensitive systems.

In embodiments of techniques described herein, existing hardware resources of a multi-dimensional (e.g., three-dimensional or 3D) convolution accelerator, which are typically unused for Vector×Matrix operations, are utilized to dynamically perform embedded vector decompression of kernel data. Advantageously, such embodiments may employ limited additional hardware overhead while significantly increasing kernel data bandwidth, especially in scenarios in which such kernel data is stored off-chip. In certain exemplary embodiments, a 3D convolution accelerator may include a relatively large line buffer memory in order to efficiently perform operations on kernels with vertical dimensions greater than one; techniques presented herein utilize such a line buffer memory as decompression table storage in order to provide additional kernel data bandwidth.

In certain embodiments, techniques described herein include including one or more data markers in a kernel data stream to identify one or more kernel decompression tables and associated compressed kernel values, such as may be dynamically decompressed during batch processing of a Vector×Matrix cycle.

Figure 2A:
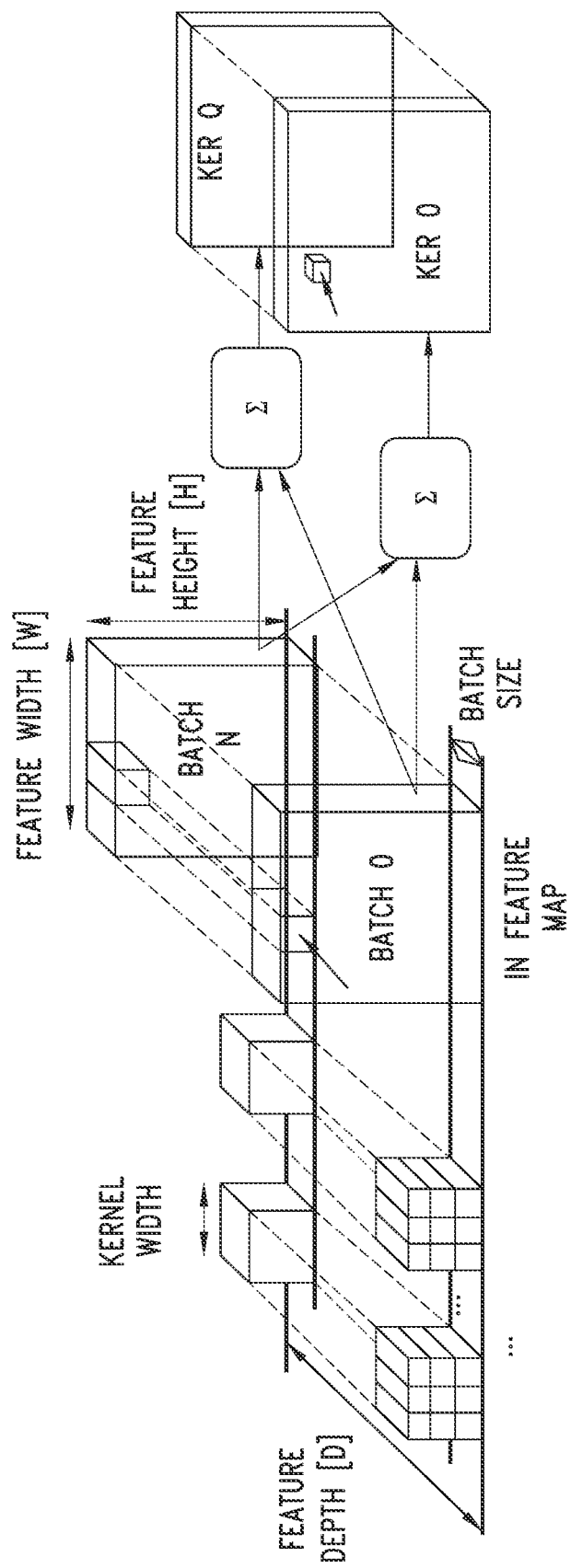
FIG. 2A conceptually depicts an example of an iterative convolution operation of a convolution accelerator implementing a neural network.

FIG. 2A depicts an iterative convolution operation of a convolution accelerator implementing a neural network, in which N−1 batches of feature data having height H, width W, and depth D are convolved with kernel data to generate input data for subsequent layers of the neural network. Notably, during such iterative convolution operations, each kernel parameter may be reused for H×W MAC operations. In one embodiment, an exemplary convolution accelerator performing such processes may include, as a non-limiting example, eighteen 16×16 bit MAC units to perform up to two 3×3 16-bit convolutions per clock cycle; in another embodiment, the convolution accelerator may include 72 8×8-bit MAC units, such as to perform up to eight 3×3 8-bit MAC operations per clock cycle. Each parameter may be reused, for example, up to 128×128 times or more than 16,000 times.

Figure 2B:
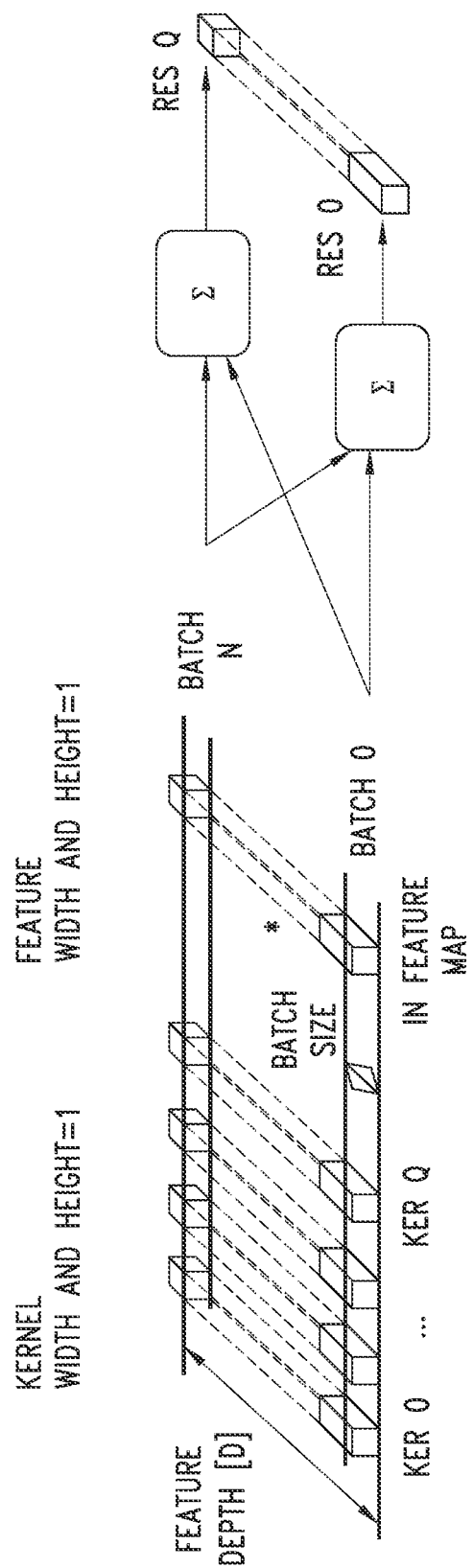
FIG. 2B conceptually depicts an example of a fully connected (Matrix×Vector) operation of a convolution accelerator implementing a neural network.

FIG. 2B depicts a fully connected (or Matrix×Vector) operation of a convolution accelerator implementing a neural network. In notable contrast to the convolution operation of FIG. 2A, each of the N−1 batches of feature data to be processed has a width W=1 and height H=1; similarly, the kernel data to be processed also has a width W=1 and height H=1. Thus, while the convolution accelerator may continue to support up to 72 MAC operations per cycle, kernel parameters may be used for only a single MAC operation. An associated kernel parameter load would require 72 bytes per cycle in order to exploit the provided calculation resources. In various circumstances, such a data rate may not be deliverable (such as, for example, due to off-chip memory access). Therefore, in practice with conventional approaches, during such fully connected (or Matrix×Vector) operations, a maximum quantity of MAC operations per cycle is limited by kernel data bandwidth.

Figure 3:
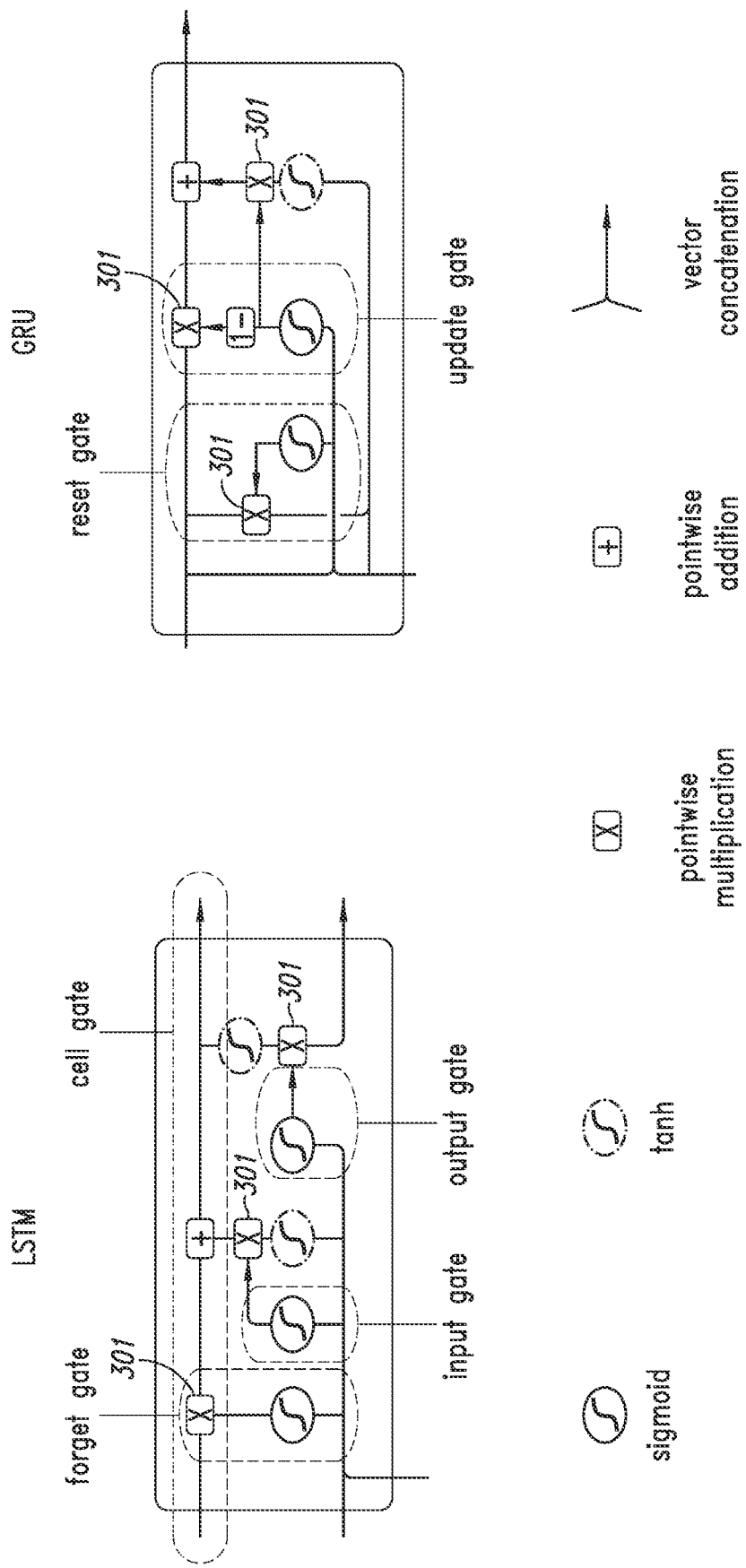
FIG. 3 illustrates examples of typical operations of two distinct types of recurrent neural networks.

FIG. 3 illustrates operations of two example types of recurrent neural networks (Long Short Term Memory (LSTM) and Gated Recurrent Unit (GRU) neural networks, respectively). As both types of these recurrent neural networks utilize pointwise multiplications 301, such recurrent neural networks typically share some of the issues discussed for fully connected layers, as potential reuse of kernel parameters per feature data value is low or even nonexistent.

Figure 4:
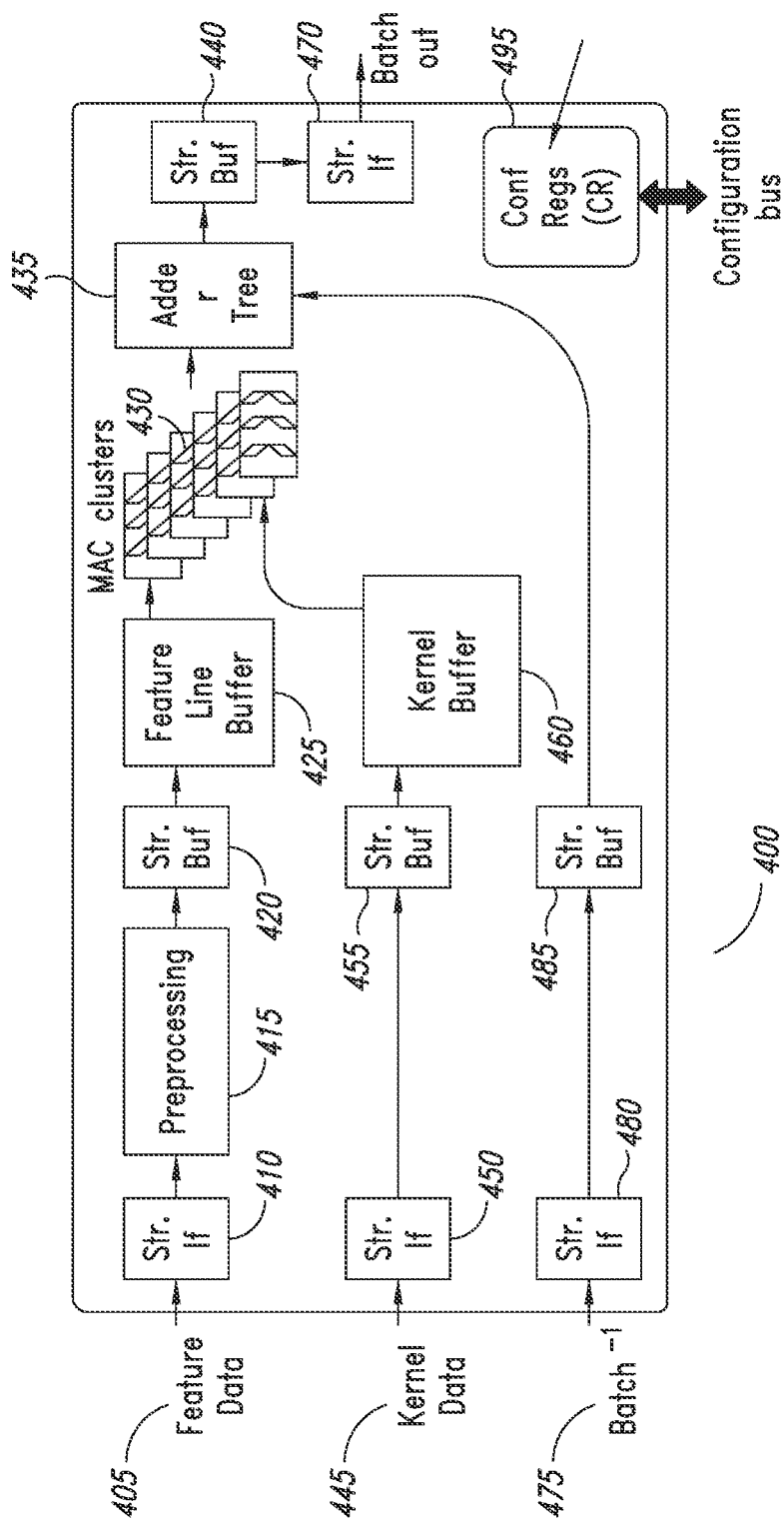
FIG. 4 depicts one embodiment of an exemplary multi-dimensional convolution accelerator.

FIG. 4 depicts an exemplary multidimensional convolution accelerator 400. In the depicted embodiment, feature data 405 is provided as input to the convolution accelerator 400 via a feature data stream interface 410, which in the depicted embodiment may check and/or verify one or more aspects of such incoming feature data 405. Feature data preprocessing circuitry block 415 receives the verified feature data from the feature data stream interface 410, and performs various preprocessing operations on the verified feature data. In the depicted embodiment the feature data preprocessing circuitry block 415 may, as non-limiting examples, perform operations that include one or more of format detection, scaling operations, saturation operations, cropping, frame extension, iteration support, and other preprocessing operations. The feature data preprocessing circuitry block 415 provides the preprocessed feature data stream to a feature line buffer memory 425 via a feature data stream buffer 420, which may be utilized, for example, to compensate for any stream data rate fluctuations. In the depicted embodiment, the feature line buffer memory 425 may store multiple lines (e.g., three lines) of feature data.

Continuing with respect to the embodiment of FIG. 4, kernel data 445 is provided as input to the convolution accelerator 400 via a kernel data stream interface 450, which in the depicted embodiment may check, filter, and/or verify various aspects of such incoming kernel data in a manner similar to that with respect to the feature data stream interface 410 and feature data 405. The kernel data stream interface 450 then provides the verified kernel data to kernel data stream buffer 455, which in the depicted embodiment may be utilized to compensate for any stream data rate fluctuations. The kernel data is then provided to kernel buffer 460, which in various embodiments may provide temporary storage for kernel data of disparate sizes. As non-limiting examples, the kernel buffer 460 may comprise memory storage sufficient to store two sets of 576 8-bit kernel values, two sets of 288 16-bit kernel values, or some other sized combination of kernel values.

During operations of a typical convolution cycle, the feature data stored by the feature line buffer memory 445 and the kernel data stored by the kernel buffer 460 are provided to a set of Multiply and ACcumulate clusters (MAC clusters) 430. As non-limiting examples, an embodiment may include eighteen 16×16 bit MAC units to perform up to two 3×3 16-bit convolutions per clock cycle; in another embodiment, the convolution accelerator may include 72 8×8-bit MAC units to perform up to eight 3×3 8-bit MAC operations per clock cycle. As another non-limiting example, in one embodiment the MAC clusters 430 may include six MAC clusters comprising four single-instruction multiple data (SIMD) MAC units and a plurality of 24-bit or 40-bit accumulators.

Output from the MAC clusters 430 is provided to adder tree 435, which in at least one embodiment may comprise a configurable 48-bit adder tree for processing of kernel columns and accumulation data, such as in order to sum results of individual convolution operations. Output from adder tree 435 is provided to a temporary streaming buffer 440 (that in a manner similar to that of stream buffers 420 and 455, may be utilized to compensate for any stream data rate fluctuations), and then to a batch output stream interface 470. In at least some embodiments, the batch output stream interface 470 may perform one or more operations that may include, as non-limiting examples: scaling operations; saturation operations; data stream regeneration operations; etc.

In at least one embodiment, output from the batch output stream interface 470 may be provided as input to one or more convolution accelerators, including convolution accelerator 400. For example, in the depicted embodiment of FIG. 4, batch output from the batch output stream interface 470 is provided as accumulation input data stream 475 to an accumulation stream interface 480, which may perform operations comprising one or more of checking, scaling, and filtering of the accumulation input data stream. The accumulation input data stream is then provided to an accumulation data stream buffer 485, for example, in order to compensate for any stream data rate fluctuations, and then as input to the adder tree 435.

Also in the depicted embodiment of FIG. 4, the convolution accelerator 400 includes configuration register (CR) block 495, which is communicatively coupled to a configuration bus external to the convolution accelerator. In the depicted embodiment, CR block 495 comprises configuration registers containing some or all functional parameters for configuration of the convolution accelerator 400.

Figure 5:
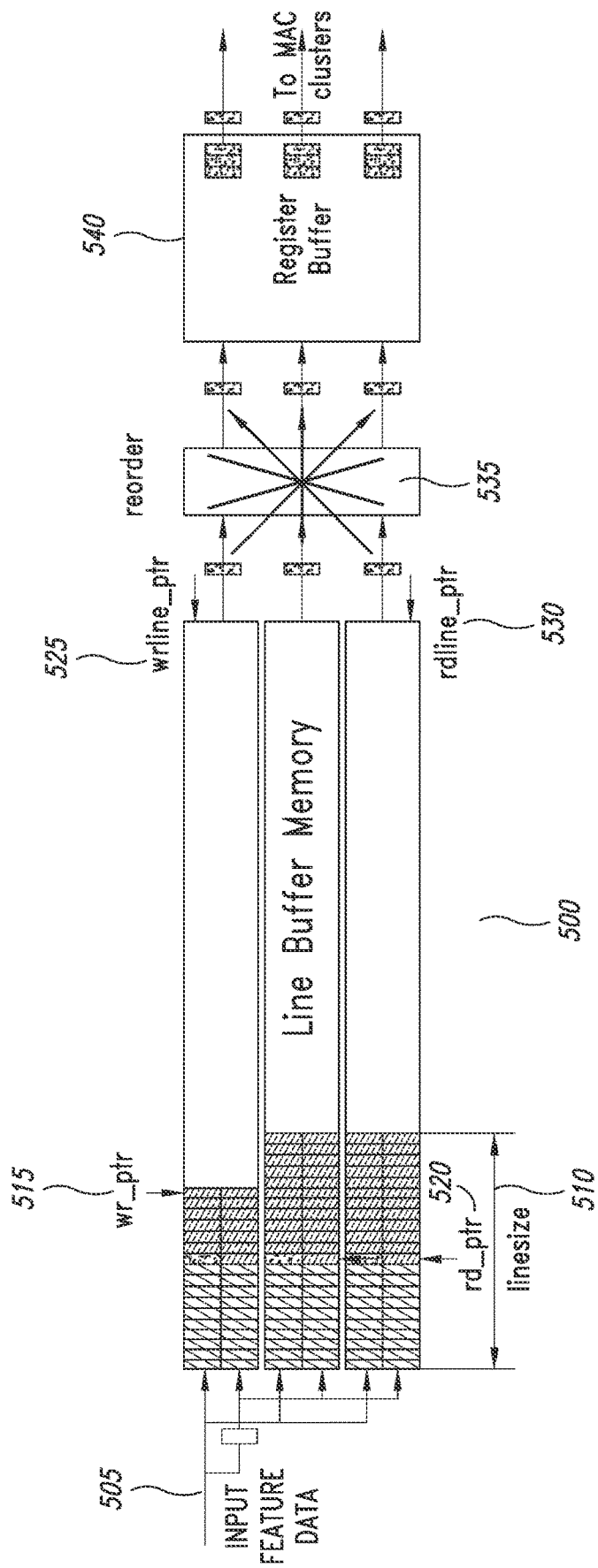
FIG. 5 depicts an exemplary embodiment of a line buffer memory in accordance with one or more embodiments of techniques described herein.

FIG. 5 depicts an exemplary embodiment of a line buffer memory 500 in accordance with one or more techniques described herein. Input feature data 505 is provided to the line buffer memory, which in the exemplary embodiment may comprise part of a convolution accelerator similar to that described above with respect to convolution accelerator 400 of FIG. 4. In the depicted embodiment, the line buffer memory 500 has a linesize dimension 510 such that the line buffer memory may store up to three lines of input feature data at a time. The line buffer memory includes read and write addressing functionality via a write address pointer "wr_ptr" 515, a read address pointer "rd_ptr" 520, a write line pointer "wrline_ptr" 525, and a read line pointer "rdline_ptr" 530. The line buffer memory further includes reordering circuitry 535, which may selectively provide addressing information in order to retrieve and store ordered feature data columns to one or more MAC clusters communicatively coupled to the line buffer memory 500 via a register buffer 540. In at least some embodiments, the line buffer memory 500 and its reordering circuitry 535 includes control logic to provide for vertical padding and vertical strides, and to provide data values without dead cycles to the MAC clusters. In one exemplary embodiment, the line buffer memory 500 comprises multiple 96-bit wide single-port memories that are configured as pseudo-dual port memories, and may additionally support storage of 8-bit values into 16-bit data portions in order to support wider feature data frames. It will be appreciated that in various embodiments, these and other parameters of the line buffer memory may be selected according to various other criteria without deviating from the techniques presented herein.

Figure 6:
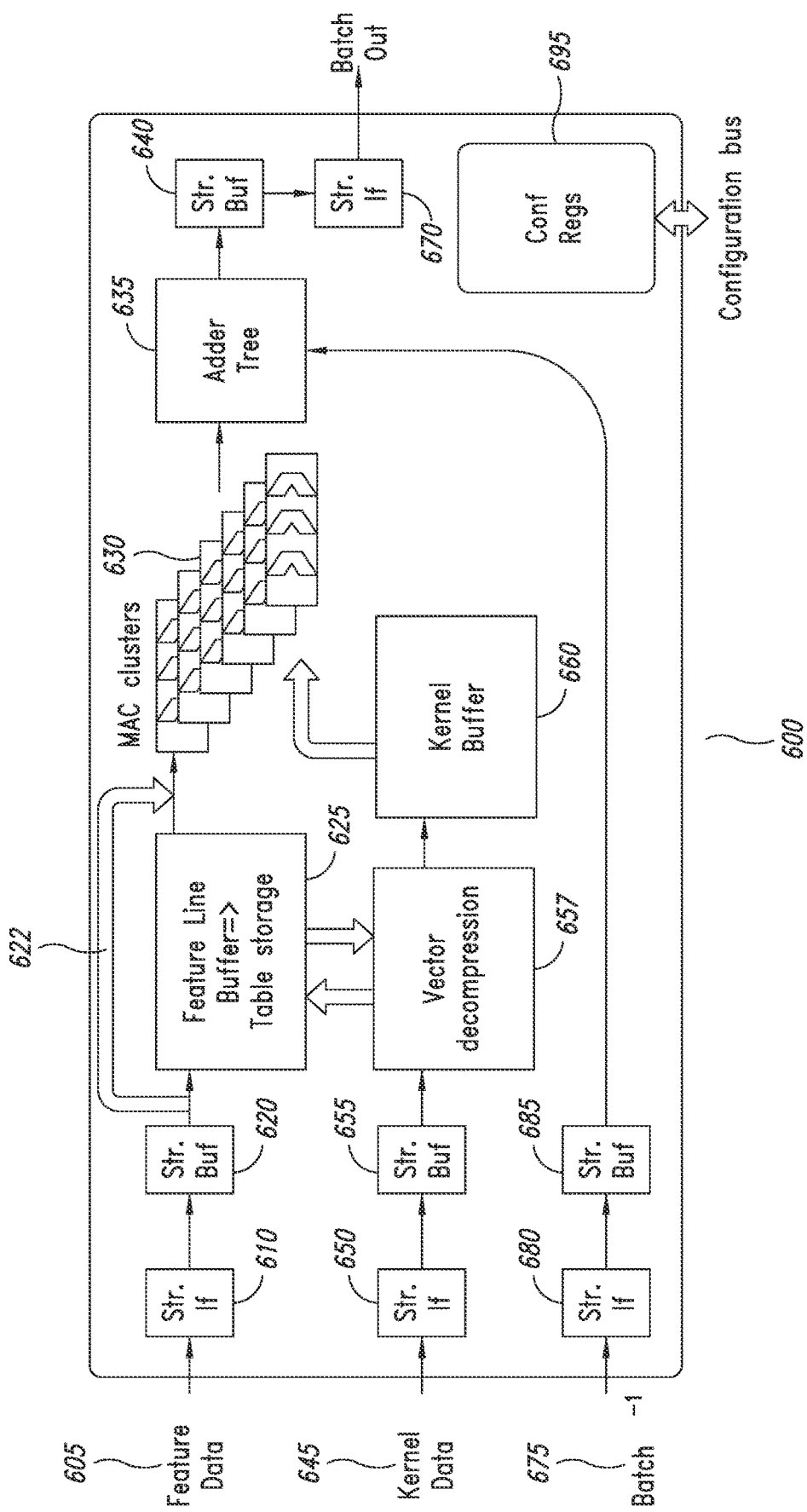
FIG. 6 depicts an exemplary embodiment of a multidimensional convolution accelerator in accordance with one or more embodiments of techniques described herein.

FIG. 6 depicts an exemplary embodiment of a multidimensional convolution accelerator 600 in accordance with one or more techniques described herein. In particular, the convolution accelerator 600 operates in two distinct modes: a first mode, in which the convolution accelerator 600 performs convolution acceleration operations similar to those described with respect to convolution accelerator 400 of FIG. 4; and a distinct second mode, in which the convolution accelerator 600 performs fully connected acceleration operations (such as Vector by Matrix operations on a feature data tensor of 1×1×Depth) by utilizing a feature line buffer as decompression kernel table storage in conjunction with a vector decompression engine or circuit 657 in order to increase kernel data bandwidth.

Operations of the convolution accelerator 600 while in the first convolution acceleration mode are performed in a manner similar to those described with respect to the convolution accelerator 400, and are detailed as follows. Feature data 605 is provided as input to the convolution accelerator 600 via a feature data stream interface 610, which in the depicted embodiment may check and/or verify one or more aspects of such incoming feature data. In the depicted embodiment, the verified feature data is provided to a feature line buffer memory 625 via a feature data stream buffer 620, which may be utilized to compensate for any stream data rate fluctuations. In contrast to the convolution accelerator 400 of FIG. 4, no preprocessing block is depicted as part of the convolution accelerator 600, but it will be appreciated that in certain embodiments additional preprocessing operations may be performed on the verified feature data prior to providing that verified feature data to the feature data stream buffer 620. In a manner similar to the feature line buffer memory 425 of FIG. 4, the feature line buffer memory 625 may store multiple lines (e.g., three or more lines) of feature data.

Continuing with the embodiment of FIG. 6 and operations of convolution accelerator 600 during the first convolution acceleration mode, kernel data 645 is provided as input to the convolution accelerator 600 via a kernel data stream interface 650, which in the depicted embodiment may check, filter, and/or verify various aspects of such incoming kernel data in a manner similar to that with respect to the feature data stream interface 610 and feature data 605. The kernel data stream interface 650 then provides the verified kernel data to kernel data stream buffer 655, which in the depicted embodiment may be utilized to compensate for any stream data rate fluctuations. In contrast to the operations described with respect to convolution accelerator 400 of FIG. 4, the kernel data is then provided to a vector decompression engine 657, which is described in greater detail elsewhere herein. The vector decompression engine 657 receives the verified kernel data stream from the kernel data stream buffer 655.

In certain embodiments, the kernel data stream is encoded to include one or more data markers, such that each data marker indicates a data content type associated with a subsequent portion of the kernel data stream. As described in greater detail elsewhere herein, in such embodiments the vector decompression engine 657 or other component of the convolution accelerator 600 may initiate an operational mode for the convolution accelerator based at least in part on whether a data marker received for the relevant clock cycle indicates that an associated subsequent portion of the kernel data stream comprises uncompressed kernel data (in which case the convolution accelerator will perform one or more operations in a convolution acceleration mode) or a kernel decompression table (in which case the convolution accelerator will perform one or more operations in a second mode, e.g., a fully connected acceleration mode, a recurrent neural network mode, etc.). For the current example of operations of the convolution accelerator 600 during the first convolution acceleration mode, we assume that a received data marker of the encoded kernel data stream indicates that the associated subsequent portion of the kernel data stream comprises uncompressed kernel data.

Operating in the first convolution acceleration mode, the vector decompression engine passes the received kernel data stream to a kernel buffer 660, which in various embodiments may provide temporary storage for kernel data of disparate size. Feature data stored by the feature line buffer memory 625 and the kernel data stored by the kernel buffer 660 are provided to a set of MAC clusters 630, which in turn provides output to the adder tree 635 for processing of kernel columns and accumulation data. Output from adder tree 635 is provided to a temporary streaming buffer 640 (that in a manner similar to that of stream buffers 620 and 655, may be utilized to compensate for any stream data rate fluctuations), and then to a batch output stream interface 670. As with convolution accelerator 400 and batch output stream interface 470 of FIG. 4, in at least some embodiments, the batch output stream interface 670 may perform one or more operations that may include, as non-limiting examples: scaling operations; saturation operations; data stream regeneration operations; etc. Output from the batch output stream interface 670 may be provided as input to one or more convolution accelerators, including convolution accelerator 600, such as if batch output from the batch output stream interface 670 is provided as accumulation input data stream 675 to accumulation stream interface 680, which may perform checking, scaling, and/or filtering of the accumulation input data stream. The accumulation input data stream is then provided to accumulation data stream buffer 685, for example, in order to compensate for any stream data rate fluctuations, and then as input to the adder tree 635.

Operations will now be described with respect to the second mode of operation, as described a fully connected operating mode for the convolution accelerator 600. As previously described with respect to the first convolution acceleration mode, feature data 605 is provided as input to the convolution accelerator 600 via the feature data stream interface 610, and then to the feature data stream buffer 620 for storage in a portion thereof. In the depicted embodiment, and in a manner different from that with respect to the first convolution accelerator mode, the verified feature data stream is provided from the feature data stream buffer 620 to the MAC clusters 630 via a bypass data path 622 which bypasses the feature line buffer 625.

Continuing with the fully connected operating mode of the embodiment of FIG. 6, kernel data 645 is provided as input to the convolution accelerator 600 via the kernel data stream interface 650, which then provides the verified kernel data to kernel data stream buffer 655. The kernel data is then provided to vector decompression engine circuit or block 657. The vector decompression engine 657 receives the verified kernel data stream from the kernel data stream buffer 655.

As noted above with respect to operations in the first convolution acceleration mode, in the depicted embodiment the kernel data stream is encoded to include one or more data markers, such that each data marker indicates a data content type associated with a subsequent portion of the kernel data stream. Also as noted above, the vector decompression engine 657 or other component of the convolution accelerator 600 may initiate a second (e.g., fully connected) operational mode for the convolution accelerator based on a received data marker indicating that an associated subsequent portion of the kernel data stream comprises one or more kernel decompression tables. Here, we assume that a received data marker of the encoded kernel data stream indicates that the associated subsequent portion of the kernel data stream comprises one or more kernel decompression tables. As described in greater detail elsewhere herein, the kernel decompression table is associated with multiple compressed kernel data values, such that the vector decompression engine 657 dynamically decompresses the compressed kernel data using the stored kernel decompression table to store the resulting decompressed kernel data table and/or associated decompressed kernel data values in the kernel data buffer 660. In some embodiments, decompressed kernel data may be stored in the feature line buffer as part of the decompression process. As a result of such operations, the decompressed kernel data values may be provided to the kernel buffer 660 with greater kernel data bandwidth than would otherwise be enabled. In various embodiments and as non-limiting examples, vectors of up to six 16-bit elements, or up to twelve 8-bit elements, may be stored in the feature line buffer 625. As indicated elsewhere herein, during fully connected operations kernels have a vertical dimension of 1 (1×1×Depth), such that it is possible that no storage of feature line data in the feature line buffer 625 is utilized, allowing such feature data to bypass the feature line buffer 625 via the bypass data path 622.

Continuing in the fully connected acceleration mode, the vector decompression engine 657 passes the decompressed kernel data values to the kernel buffer 660. The kernel data stored by the kernel buffer 660, along with the feature data provided from the stream buffer 620 via the bypass data path 622, are provided to MAC clusters 630, which in turn provides output to the adder tree 635 for processing of kernel columns and accumulation data. In a manner similar to that described with respect to operations in the first convolution acceleration mode, output from adder tree 635 is provided to the temporary streaming buffer 640, and then to the batch output stream interface 670. Output from the batch output stream interface 670 may be provided as input to one or more convolution accelerators, including convolution accelerator 600, such as if batch output from the batch output stream interface 670 is provided as accumulation input data stream 675 to accumulation stream interface 680, and then to accumulation data stream buffer 685 before being provided as input to the adder tree 635.

Also in the depicted embodiment of FIG. 6, the convolution accelerator 600 includes configuration register (CR) block 695, communicatively coupled to an external configuration bus and comprising configuration registers containing some or all functional parameters for configuration of the convolution accelerator 600.

Figure 7:
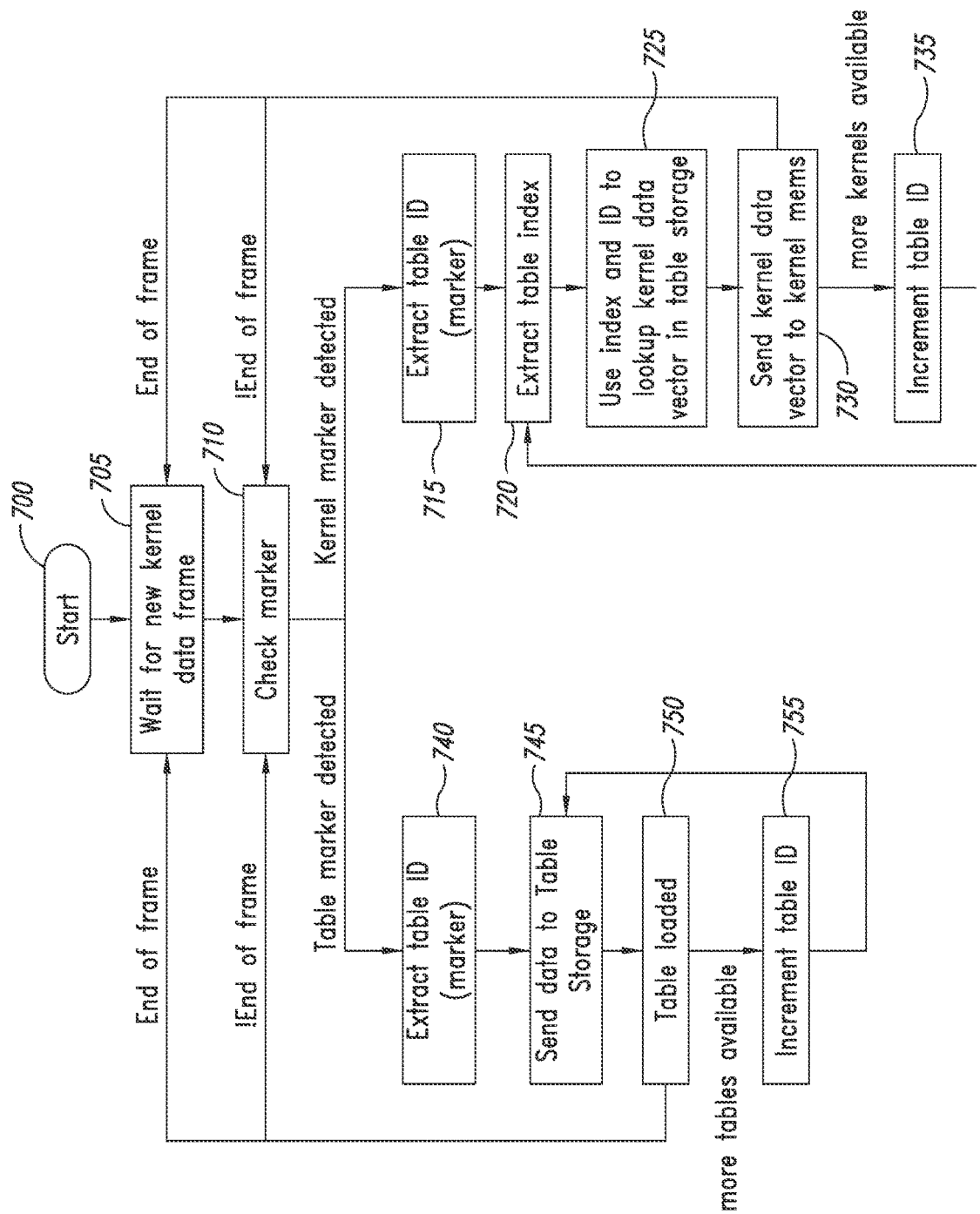
FIG. 7 depicts an exemplary operational vector decompression routine for a convolution accelerator in accordance with one or more embodiments of techniques described herein.

FIG. 7 depicts one embodiment of a decompression operational routine, such as may be performed by a vector decompression engine of a convolution accelerator (e.g., vector decompression engine 657 of convolution accelerator 600 in FIG. 6) in accordance with one or more techniques described herein. The routine begins at block 700 and proceeds to block 705, in which the routine waits for a new kernel data frame as part of an input kernel data stream (such as may be received, with reference to the embodiment of FIG. 6, by vector decompression engine 657 via kernel data stream interface 650 and kernel data stream buffer 655). Once the new kernel data frame is received, the routine proceeds to block 710 and checks the received kernel data frame for a data marker indicating a data type of a subsequent portion of the kernel data frame. In at least some embodiments, the data marker may include, as non-limiting examples: a position indicator associated with a next additional data marker within the kernel data frame, if any; a data type of a subsequent portion of the kernel data frame (e.g., whether the subsequent portion comprises a compressed kernel data table or uncompressed kernel data values); and a table index value associated with the data marker, such as to identify a storage address and/or compressed kernel data table to be used for decompression.

If in block 710 it was detected that the data marker indicates that the subsequent portion of the kernel data frame comprises compressed kernel data values, the routine proceeds to block 715 to extract a data table identifier from the data marker (e.g., an index or position information identifying the table used to decompress the compressed kernel data). The routine then proceeds to block 720 and extracts an associated table index value from the compressed kernel data, then to block 725, in which the routine looks up an associated kernel data vector from table storage based on the extracted table identifier and table index value. At block 730, the routine provides the associated kernel data vector to a kernel memory of the convolution accelerator (e.g., kernel buffer 660 of convolution accelerator 600 in FIG. 6). The routine then determines whether additional kernel data is associated with the most recent data marker of the kernel data frame. If so, the routine proceeds to block 735, increments the table identifier (e.g., to a second table indicated by the marker), and returns to block 720 to extract the table index value associated with the kernel data; otherwise, the routine returns to block 710 if the end of the kernel data frame has not been reached, or to block 705 if the end of the kernel data frame has been reached.

If in block 710 it was detected that the data marker indicates that the subsequent portion of the kernel data frame comprises a kernel decompression table, the routine proceeds to block 742 extract a data table identifier from the data marker. The routine then proceeds to block 745 and stores the kernel decompression table to kernel decompression table storage (the feature line buffer 625 of convolution accelerator 600 in FIG. 6). At block 750, after the table is loaded into the kernel decompression table storage, the routine determines whether an additional kernel decompression table is associated with the most recent data marker of the kernel data frame. If an additional compressed kernel data table is associated with the most recent data marker, the routine proceeds to block 755, increments the table identifier, and returns to block 745 in order to store the additional kernel decompression table to decompression table storage (the feature line buffer 625). If no additional kernel decompression table is associated with the most recent data marker, the routine instead returns to block 710 if the end of the kernel data frame has not been reached, or to block 705 if the end of the kernel data frame has been reached.

It will be appreciated that in various embodiments of the decompression engine operational routine depicted in FIG. 7 may contain additional operations not specifically shown, may not contain all of the acts shown in FIG. 7, may perform operations shown in FIG. 7 in various orders, and may be modified in various respects. For example, in some embodiments a kernel data frame may include kernel data tables in uncompressed formats, and a data marker may indicate whether a subsequent portion of a kernel data frame includes a kernel data table in an uncompressed format. In such embodiments, block 745 may be modified to store received uncompressed tables in table storage without performing decompression. In another example, when at block 710 a kernel data marker indicates in a data frame comprises uncompressed kernel data, the routine may proceed to send the uncompressed kernel data to the kernel memory, and return to block 710 if the end of the kernel data frame has not been reached, or to block 705 if the end of the kernel data frame has been reached.

Figure 8:
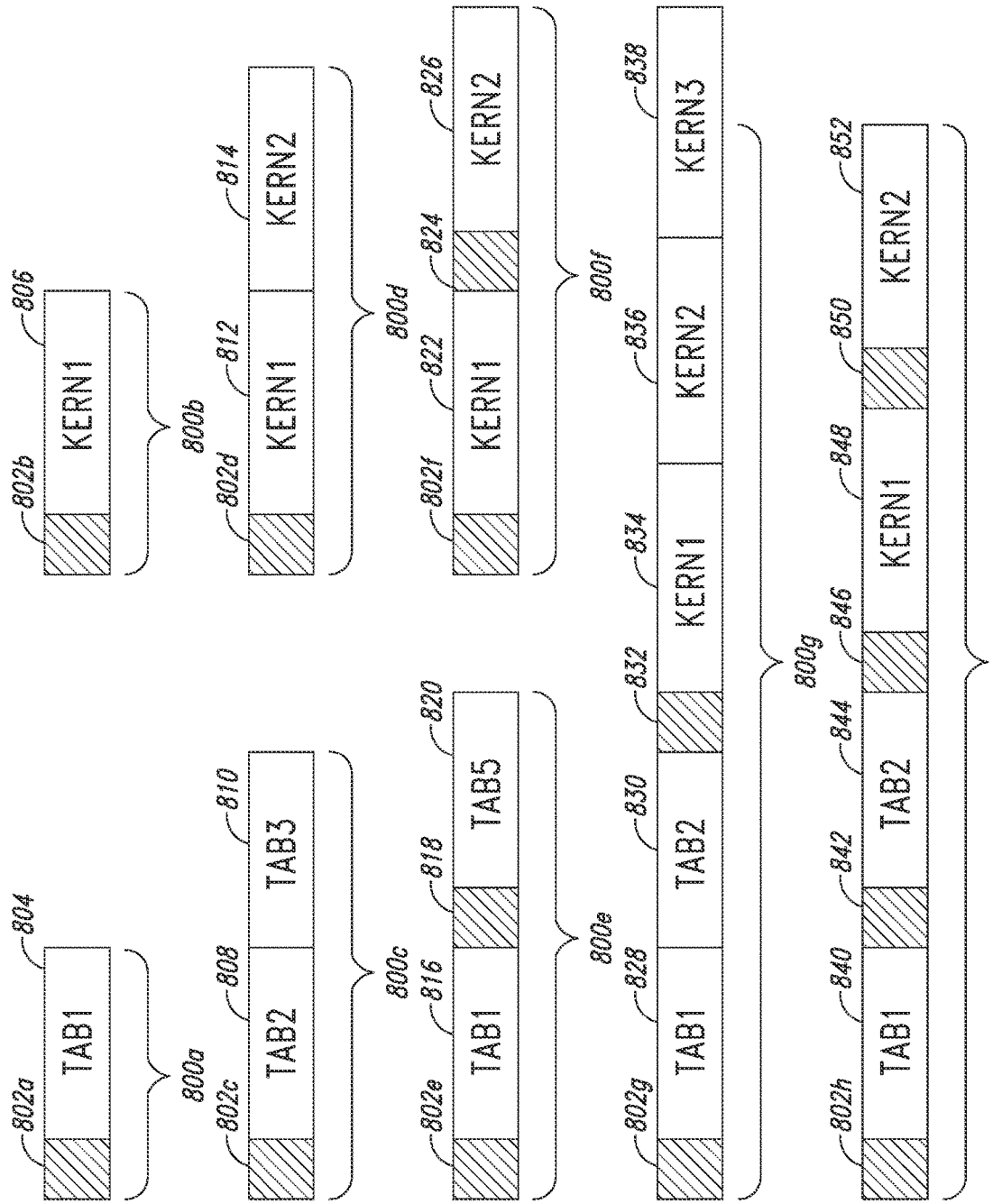
FIG. 8 depicts various instances and arrangements of kernel data frames, such as may be received as part of a kernel data stream in accordance with embodiments of an extended kernel data stream format and other techniques described herein.

FIG. 8 depicts various instances and arrangements of exemplary kernel data frames 800a-800h (collectively referred to herein as exemplary kernel data frames 800), such as may be received as part of a kernel data stream in accordance with embodiments of an extended kernel data stream format and other techniques described herein. In the particular depicted embodiments, each of the exemplary kernel data frames 800 begins with a data word corresponding to an initial data marker 802a-802h (collectively referred to herein as initial data markers 802), as well as one or more interleaved compressed kernel data tables and/or kernel data values. As noted elsewhere herein, each of the initial data markers 802 may comprise, as non-limiting examples: a position indicator associated with a next additional data marker within the kernel data frame, if any; a data type of a subsequent portion of the kernel data frame (e.g., whether the subsequent portion comprises a kernel decompression table, compressed kernel data values, uncompressed kernel data values, etc.); and a table index value associated with the data marker, such as to identify a storage address and/or compressed kernel data table to be used for decompression.

Each of exemplary kernel data frames 800a and 800b comprise a single kernel decompression table, compressed kernel data value set or, in some embodiments, an uncompressed kernel data value set. In particular, exemplary kernel data frame 800a comprises a single kernel decompression table 804; exemplary kernel data frame 800b comprises a set of compressed kernel data values 806.

Each of exemplary kernel data frames 800c and 800d comprise multiple sequential kernel decompression tables or multiple sequential (compressed or uncompressed) sets of kernel data values. In particular, exemplary kernel data frame 800c comprises first and second sequential kernel decompression tables 808 and 810; exemplary kernel data frame 800d comprises first and second sequential compressed kernel data values sets 812 and 814.

Each of exemplary kernel data frames 800e and 800f comprise multiple non-sequential kernel decompression tables or multiple non-sequential compressed kernel data value sets, as well as an additional data marker referencing the next non-sequential kernel decompression table identifier or the next compressed kernel data value set. In particular, exemplary kernel data frame 800e comprises the initial data marker 802e referencing kernel decompression table 816, a second data marker 818 referencing non-sequential kernel decompression table 820, and the kernel decompression tables 816, 820; exemplary kernel data frame 800f comprises the initial data marker 802f referencing compressed kernel data values 822, a second data marker 824 referencing non-sequential compressed kernel data values 826, and the compressed kernel data values 822, 826.

Exemplary kernel data frame 800g comprises sequential kernel decompression tables as well as sequential compressed kernel data values. In particular, the exemplary kernel data frame 800g comprises the initial data marker 802g, referencing sequential kernel decompression tables 828 and 830; the sequential kernel decompression tables 828 and 830; a second data marker 832, referencing sequential compressed kernel data value sets 834, 836, and 838; and the sequential compressed kernel data value sets 834, 836, and 838.

Exemplary kernel data frame 800h comprises non-sequential kernel decompression tables as well as non-sequential compressed kernel data value sets. In particular, the exemplary kernel data frame 800h comprises the initial data marker 802g, referencing a first kernel decompression table 840; a second data marker 842, referencing non-sequential kernel decompression table 844; the kernel decompression table 844; a third data marker 846, referencing compressed kernel data values 848; the compressed kernel data values 848; a fourth data marker 850, referencing compressed kernel data values 852; and the compressed kernel data values 852.

Figure 9:
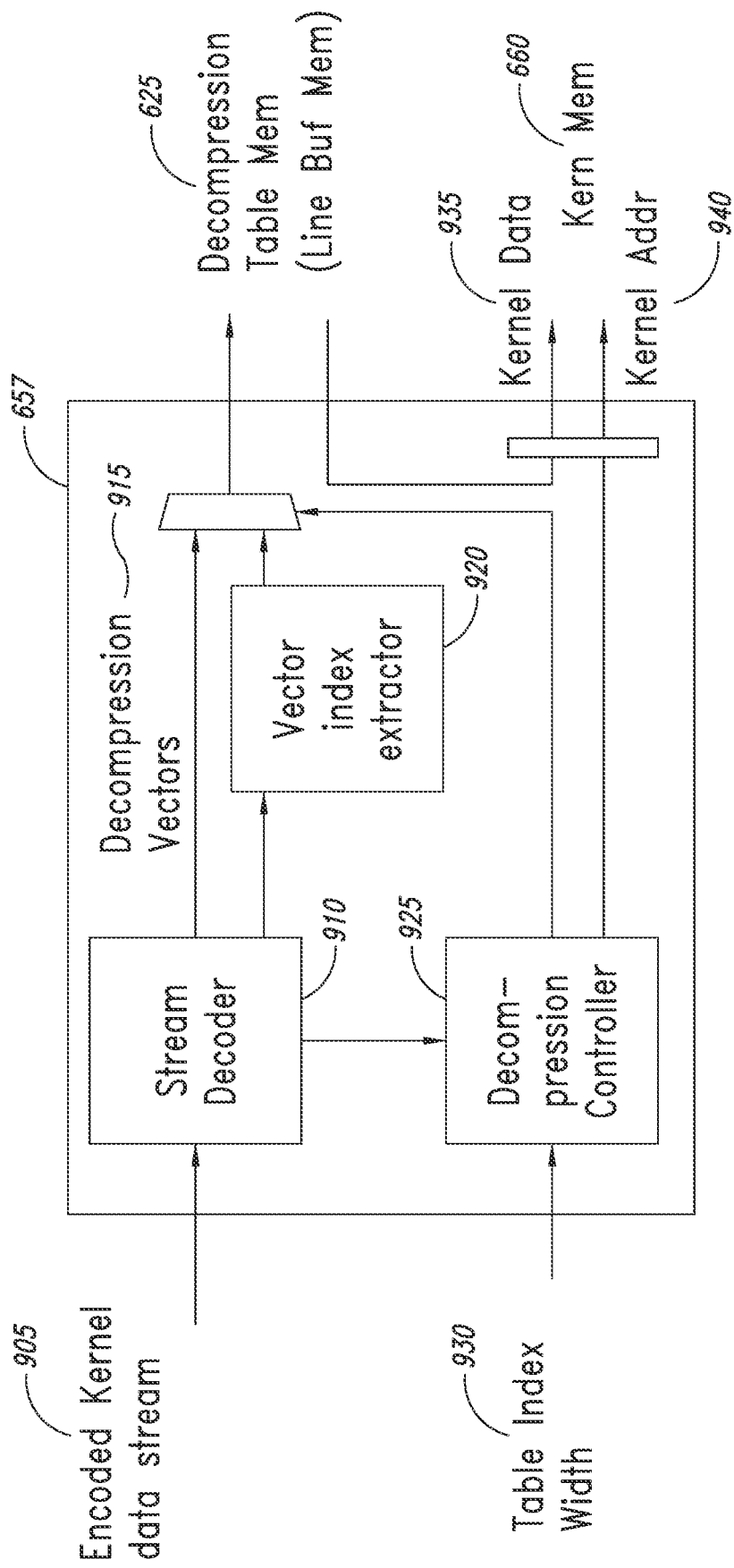
FIG. 9 is a block diagram depicting an embodiment of a vector decompression engine within a convolution accelerator configured in accordance with one or more techniques described herein.

FIG. 9 is a block diagram depicting in greater detail an embodiment of vector decompression engine 657 from the convolution accelerator 600 of FIG. 6. In particular, the vector decompression engine 657 comprises a stream decoder 910 to decode frames of the kernel data stream, generating one or more decompression vectors 915, based on an input encoded kernel data stream 905 provided to the vector decompression engine; a vector index extractor 920 to extract index values and size information from the decompression vector information provided by the stream decoder 910; and a decompression controller 925 to provide, based on table index width information 930 and information decoded from kernel data stream, control information for storing and retrieving the decompression vectors 915 of the kernel decompression tables in the decompression table memory 625, and to provide kernel addressing information 940 with the decompressed kernel data to the kernel memory 660.

In operation, the vector decompression engine 657 receives the encoded kernel data stream 905 and the table index width information 930, as well as kernel vectors retrieved from the feature line buffer 625; provides decompressed kernel data values 935 and kernel addressing information 940 to the kernel buffer 660; and provides decompression vectors 915 and vector index and size information to the feature line buffer 625 for storage as kernel decompression tables.

In some embodiments, the exemplary convolution accelerators described herein may include more components than illustrated, may include fewer components than illustrated, may split illustrated components into separate components, may combine illustrated components, etc., and various combinations thereof.

For example, with reference to FIG. 6, part of the described functionality of the vector decompression engine 657 may be provided in the kernel stream interface circuit 650, such as decoding data markers in a kernel data stream, which may be used to determine a mode of operation of the convolutional accelerator 600. In another example, with reference to FIG. 6, a mode of operation signal may be provided to the convolutional accelerator 600, for example when the accelerator is configured to operate in a recurrent neural network mode. External signals and information extracted from a kernel data stream, such as extracted data markers, may be used alone, or in various combinations, to control operational modes of a convolutional accelerator.

In another example, the decompression table memory/line buffer memory 625 of the convolutional accelerator 600 or the kernel buffer memory 660, or both, may be split into memory cuts, which may be employed to pre-load data for subsequent operations, load data for multiple MACs of the MAC clusters 630 in parallel, etc. For example, in a fully connected operational mode, memory cuts may be employed to load multiple kernel parameters associated with multiple vector indexes into multiple MACs in parallel. For example, with a variable table index width (e.g., 5-9 bits) and vector length (e.g., 1-12 8-bit kernel parameters or 1-6 16-bit kernel parameters), the feature line buffer/table storage memory 625 of an embodiment may be configured to store multiple tables (e.g., up 16 tables with up to 512 entries each). In such an embodiment, for each received vector index, up to 12 kernel parameters may be loaded in parallel into the kernel buffer 660 and used to feed 12 MACs of the MAC clusters 630. Using the feature line buffer/table storage memory 625 to store multiple tables and splitting the kernel memory into memory cuts facilitates processing of multiple vector indexes in parallel. For example, if N vector indexes are processed in parallel using the multiple memory cuts, up to N times 12 kernel parameters may be loaded into the kernel buffer 660 and used to feed up to N times 12 MACs of the MAC clusters in every clock cycle.

FIG. 10A illustrates an average potential, for each of four popular neural networks (Alexnet, VGG16, RESNET50, and GoogleNet, respectively) for reuse of a loaded kernel parameter with respect to a quantity of multiple MAC operations without reloading the kernel parameter from external memory. As indicated, the reuse ratio (MAC operations per parameter or MACS/parameter) for convolutional layers of the respective neural networks ranges between 268.1 (for GoogleNet) and 1036.9 (for VGG16) MAC operations per loaded kernel parameter. In contrast, fully connected layers provide no reuse potential at all, indicating a reuse ratio of 1.

FIG. 10B illustrates a number of cycles for each of the respective popular neural networks of FIG. 10B to load KVAL in a fully connected layer. To determine the values of FIG. 10B, a single convolution accelerator having 72 MAC units was operated at a clock speed of 1 GHz, loading from external memory via an Octo-SPI interface having a bandwidth of 200 MB per second. As indicated, the low or nonexistent reuse of the kernel parameters in fully connected layer calculations results in significant constraints for parallel calculations by the bandwidth constraints associated with external memory access. Such bandwidth constraints are often in effect due to fully connected layer kernel parameter sets typically being too large for on-chip storage.

One or more embodiments may facilitate providing significant improvement in the reuse potential, throughput and parallelism of convolutional accelerators during some operational modes, such as when vector by matrix operations are being performed, e.g., in a fully connected layer or recurrent neural network operational mode. For example, as discussed above, reuse of the line buffer memory used during convolutional operations to instead store vector decompression tables in other modes of operation (e.g., fully connected or recurrent neural network modes of operation), may facilitate providing significant improvements in reuse potential, throughput and parallelism.

Figure 11:
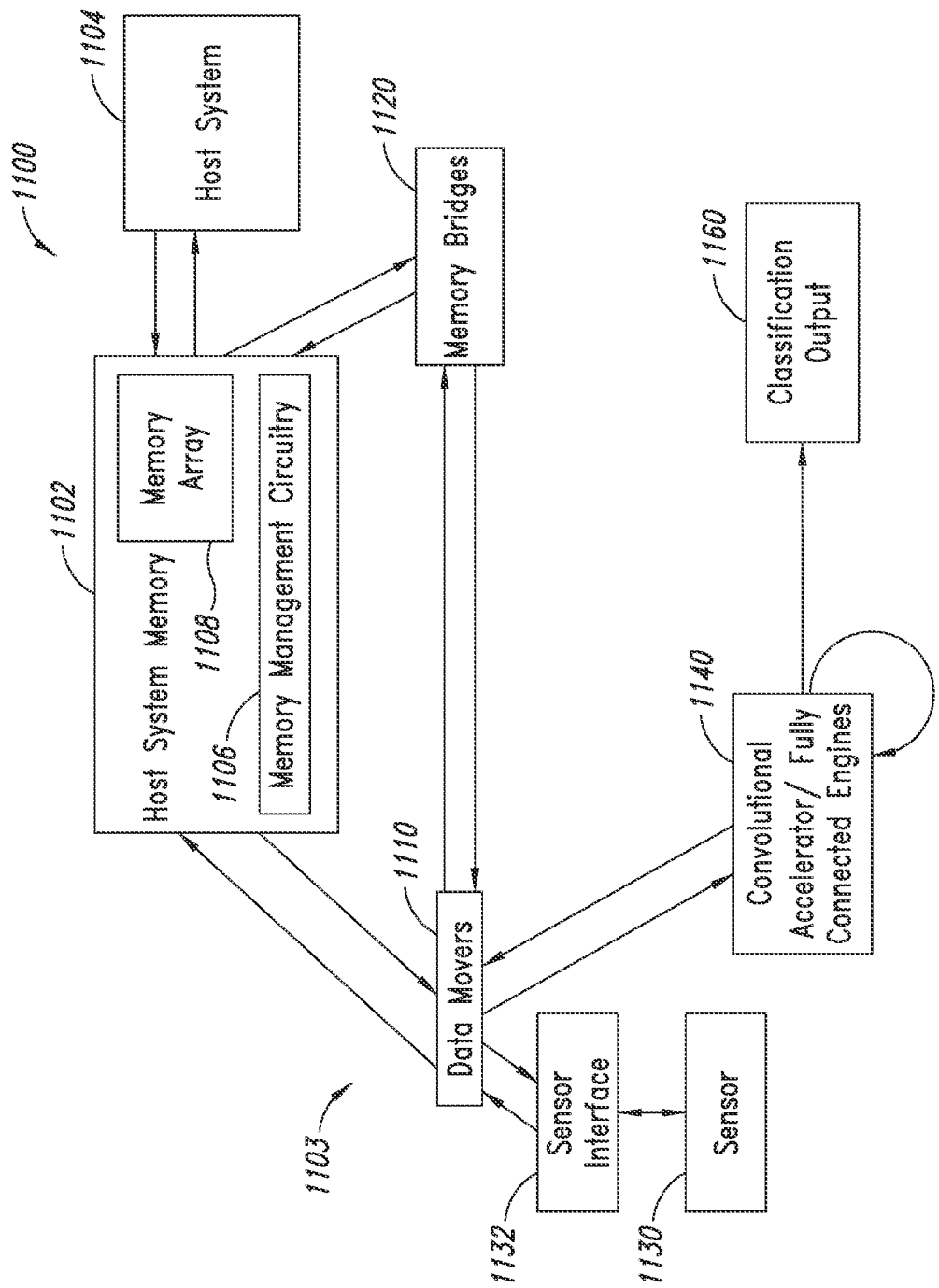
FIG. 11 is a functional block diagram of an embodiment of an electronic device or system implementing an artificial neural network that employs one or more convolutional accelerators in accordance with one or more embodiments disclosed herein.

FIG. 11 is a functional block diagram of an embodiment of an electronic device or system 1100 of the type to which the embodiments which have been described may apply. The system 1100 may be used, for example, to implement an ANN to classify sensor data. It is noted that the embodiment of FIG. 11 may comprise a system on a chip.

The system 1100 comprises a host system memory 1102, which may serve for example as a primary storage memory for both ANN 1103 processes or clusters, and for host system 1104 processes or clusters. The host system memory 1102 comprises memory management circuitry 1106 and one or more memory arrays 1108. The memory management circuitry 1106, in operation, employs one or more memory management routines to allocate regions of the memory arrays 1108 to various processes executed by the system 1100.

As illustrated, the ANN 1103 comprises one or more data movers 1110, one or more memory bridges 1120, one or more sensors 1130 and corresponding sensor interfaces 1132, and one or more convolutional accelerator/fully connected engines 1140, which may comprise for example, one or more convolutional accelerators such as the convolutional accelerator 600 of FIG. 6. Efficiency in terms of power usage, processing time and physical area may be facilitated by efficient reuse of memory of the convolutional accelerator and processing techniques such as described herein, for example, with respect to FIGS. 6 to 9. Accelerating CDNN convolutional layers may account for more than 90% of total operations. Efficient balancing of the computational and memory resources for both bandwidth and area may facilitate achieving better throughput without hitting associated ceilings.

In some embodiments, the system 1100 may include more components than illustrated, may include fewer components than illustrated, may split illustrated components into separate components, may combine illustrated components, etc., and various combinations thereof. For example, the secondary memory 1108 of FIG. 11 may comprise an external memory coupled to the system 1100 through an interface, in addition to or instead of an internal secondary memory.

Some embodiments may take the form of or comprise computer program products. For example, according to one embodiment there is provided a computer readable medium comprising a computer program adapted to cause one or more processing devices to perform one or more of the methods or functions described above. The medium may be a physical storage medium, such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the methods and/or functionality may be implemented or provided in other manners, such as at least partially in firmware and/or hardware, including, but not limited to, one or more application-specific integrated circuits (ASICs), digital signal processors, discrete circuitry, logic gates, standard integrated circuits, controllers (e.g., by executing appropriate instructions, and including microcontrollers and/or embedded controllers), field-programmable gate arrays (FPGAs), complex programmable logic devices (CPLDs), etc., as well as devices that employ RFID technology, and various combinations thereof.

In the foregoing description, certain specific details are set forth to provide a thorough understanding of various disclosed embodiments. However, one skilled in the relevant art will recognize that embodiments may be practiced without one or more of these specific details, or with other methods, components, materials, etc. In other instances, well-known structures associated with electronic and computing systems including client and server computing systems, as well as networks, have not been shown or described in detail to avoid unnecessarily obscuring descriptions of the embodiments.

Unless the context requires otherwise, throughout the specification and claims which follow, the word "comprise," and variations thereof, such as "comprises" and "comprising," are to be construed in an open, inclusive sense, e.g., "including, but not limited to."

Reference throughout this specification to "one embodiment" or "an embodiment" and variations thereof means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content and context clearly dictates otherwise. It should also be noted that the conjunctive terms, "and" and "or" are generally employed in the broadest sense to include "and/or" unless the content and context clearly dictates inclusivity or exclusivity as the case may be. In addition, the composition of "and" and "or" when recited herein as "and/or" is intended to encompass an embodiment that includes all of the associated items or ideas and one or more other alternative embodiments that include fewer than all of the associated items or ideas.

The headings and Abstract of the Disclosure provided herein are for convenience only and do not limit or interpret the scope or meaning of the embodiments.

The various embodiments described above can be combined to provide further embodiments. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A system for implementing a convolutional neural network (CNN), the system comprising:
   one or more convolution accelerators, each of the one or more convolution accelerators including:
      a feature line buffer memory;
      a kernel buffer memory; and
      a multiply-accumulate (MAC) cluster including a plurality of MAC circuits coupled to the feature line buffer memory and to the kernel buffer memory, and which, in operation, multiply and accumulate received feature data and kernel data,
   wherein, each of the one or more convolution accelerators performs first operations in a first mode in which the feature line buffer memory stores feature data, and second operations in a second mode in which the feature line buffer memory stores kernel decompression tables.

2. The system according to claim 1, wherein the first mode is a convolutional acceleration mode.

3. The system according to claim 1, wherein the second mode is a fully connected acceleration mode.

4. The system according to claim 1, wherein, during operation in the first mode, feature data is provided to the MAC cluster via the feature line buffer memory, and during operation in the second mode, feature data is provided to the MAC cluster via a data path that bypasses the feature line buffer memory.

5. The system according to claim 1, wherein each of the one or more convolution accelerators comprise one or more vector decompression engines that, during operation in the second mode, use kernel decompression tables stored in the feature line buffer memory to provide decompressed kernel data to the kernel buffer memory, which, in operation, provides the kernel data to one or more of the plurality of MAC circuits of the MAC cluster.

6. The system according to claim 5, wherein in operation the one or more vector decompression engines receive encoded kernel data streams comprising one or more kernel data frames, and wherein the one or more kernel data frames include one or more data markers that each indicate a data type of one or more subsequent portions of the encoded kernel data stream.

7. The system according to claim 6, wherein the indicated data type is a first type signifying compressed kernel data values or a second type signifying kernel decompression tables.

8. The system of claim 6, wherein a data marker indicates:
   a position associated with a next additional data marker within the kernel data frame;
   a table indicator associated with the data marker; or
   combinations thereof.

9. The system according to claim 5, wherein, during operation in the second mode, a number of the plurality of MAC circuits of a MAC cluster of one of the convolutional accelerators multiply and accumulate received feature data and kernel data in parallel.

10. The system according to claim 1, wherein each of the one or more convolution accelerators comprises a vector decompression engine that, during operation in the second mode, provides kernel decompression tables to the feature line buffer memory for storage and decompressed kernel data to the MAC cluster of the convolutional accelerator.

11. The system according to claim 1, wherein, in operation, a first of the one or more convolution accelerators initiates the second mode based at least in part on receiving a first data marker within a first kernel data stream, wherein the first data marker indicates that a subsequent portion of the first kernel data stream comprises a kernel decompression table.

12. The system according to claim 1, wherein, in operation, a first of the one or more convolution accelerators initiates the first mode based at least in part on receiving a first data marker within a first kernel data stream that indicates a subsequent portion of the first kernel data stream comprises uncompressed kernel data values.

13. The system according to claim 1, comprising a host processor and a host system memory coupled to the one or more convolutional accelerators, wherein the system is a system on a chip.

14. A convolution accelerator, comprising:
   a feature line buffer memory;
   a kernel buffer memory; and
   a multiply-accumulate (MAC) cluster coupled to the feature line buffer memory and to the kernel buffer memory and comprising a plurality of MAC circuits, wherein the plurality of MAC circuits, in operation, multiply and accumulate feature data and kernel data,
   wherein, in operation, the convolution accelerator performs first operations in a first mode in which the feature line buffer memory stores feature data, and second operations in a second mode in which the feature line buffer memory stores kernel decompression tables.

15. The convolution accelerator according to claim 14, wherein the first mode is a convolutional acceleration mode.

16. The convolutional accelerator according to claim 14 wherein the second mode is a fully connected acceleration mode.

17. The convolution accelerator according to claim 14, comprising a data path coupled to the MAC cluster and that bypasses the feature line buffer memory, wherein, during operation in the second mode, feature data is provided to the MAC cluster via the data path that bypasses the feature line buffer memory.

18. The convolution accelerator according to claim 14, comprising one or more vector decompression engines that, during operation in the second mode:
   provide vector decompression tables to the feature line buffer memory for storage;
   decompress compressed kernel data using the decompression tables stored in the feature line buffer memory; and
   provide decompressed kernel data to the kernel buffer memory.

19. The convolution accelerator according to claim 18, wherein each of the one or more vector decompression engines is associated with multiple MAC circuits of the MAC cluster.

20. The convolution accelerator according to claim 18, wherein, in operation, the one or more vector decompression engines receive encoded kernel data streams each comprising one or more kernel data frames, wherein the one or more kernel data frames include one or more data markers that each indicate a data type of a subsequent portion of the encoded kernel data stream.

21. The convolution accelerator according to claim 20, wherein a data marker indicates a subsequent data portion data type is one of a group consisting of:
   a kernel decompression table; and
   compressed kernel data.

22. The convolution accelerator according to claim 20, wherein a data marker indicates a subsequent data portion data type is one of a group consisting of:
   a kernel decompression table;
   compressed kernel data; and
   uncompressed kernel data.

23. The convolution accelerator according to claim 14, wherein, in operation, the second mode is initiated in response to receiving a first data marker within a first kernel data stream indicating a subsequent portion of the first kernel data stream comprises a kernel decompression table.

24. The convolutional accelerator according to claim 14, wherein, during operation in the second mode, the multiple MAC circuits of the MAC cluster operate in parallel to multiply and accumulate feature data and kernel data.

* * * * *